United States Patent [19]

Snethen

[11] 3,961,250
[45] June 1, 1976

[54] LOGIC NETWORK TEST SYSTEM WITH SIMULATOR ORIENTED FAULT TEST GENERATOR

[75] Inventor: Thomas J. Snethen, Wappinger Falls, N.Y.

[73] Assignee: International Business Machines Corporation, Armonk, N.Y.

[22] Filed: May 8, 1974

[21] Appl. No.: 468,108

[52] U.S. Cl. .................. 324/73 R; 235/153 AC
[51] Int. Cl.² .................. G01R 15/12; G06F 11/00
[58] Field of Search ........... 324/73 R; 235/153 AC; 340/172.5

[56] References Cited
UNITED STATES PATENTS
3,614,608  10/1971  Giedd ........................ 324/73 R OTHER PUBLICATIONS
Manning, E. G., Chang, H. Y., "A Comparison of Fault Simulation Methods . . ." Digest of the 1st Annual IEEE Computer Conference, Chicago, Ill., Sept. 6–8, 1967, pp. 10–13.

Primary Examiner—John K. Corbin
Assistant Examiner—Rolf Hille
Attorney, Agent, or Firm—T. E. Galanthay

[57] ABSTRACT

Disclosed is a technique for testing highly complex, functional logic where long sequences of test patterns are needed. A logic network to be tested comprises a large number of logic blocks. The inputs to several of these logic blocks are also the primary inputs (PI) to the logic network to be tested while the output of several of the logic blocks are also outputs (PO) of the logic network to be tested. However, the inputs and outputs of many logic blocks of the network to be tested are inaccessible since as is well known in large scale integration (LSI), a large number of internal circuit nodes cannot be probed directly. In accordance with the present disclosure, such a logic network to be tested is simulated and each of the logic blocks as well as the inputs and outputs of each of these logic blocks is uniquely defined. A first test pattern is then applied to the primary inputs (PI) of the network to set the logic levels on these primary inputs to known values. A particular one of the logic blocks within the network is then selected and a specific fault associated with the particular logic block is assumed. A test value for this assumed specific fault in the simulated network is then propagated towards a primary output, one logic stage at a time, by backtracing through the network to a primary input to determine which primary input value must be altered in order to propagate the assumed fault towards a primary output. Without developing an entire test sequence, analysis at each step determines whether the test is in fact progressing by propagating the test value through the network toward the primary input. The term "test value" is defined as the binary vaue of a point within the logic network that is opposite from that expected in the absence of the assumed fault. When a "test value" has been successfully propagated to a primary output (PO), then it is known that the particular sequence of input test patterns is suitable for detecting the specific fault assumed in the simulator. By applying the same sequence of test patterns to the actual network under test and comparing the primary outputs of the network under test and primary outputs of the simulated network, it is determined whether the particular assumed simulated fault is actually present in the network under test. On a real time basis, each time a successive pattern is applied to the simulated network, it is analyzed, and if found unsuitable, it is discarded and a different changed input pattern is sought by backtracing to a primary input through a different path. Each successive pattern is applied to the network under test only if found to be valid.

8 Claims, 31 Drawing Figures

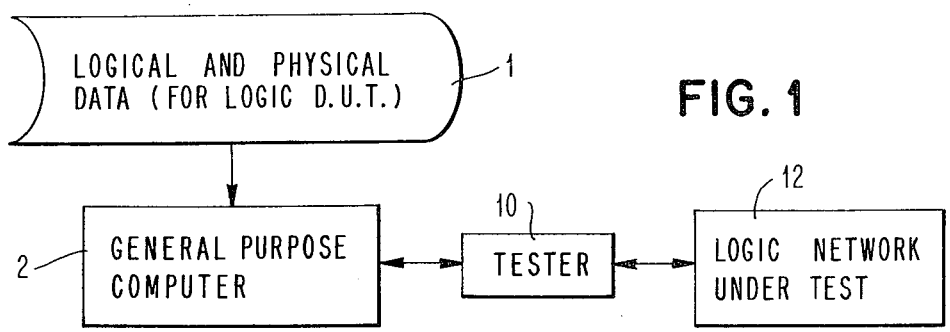
FIG. 1
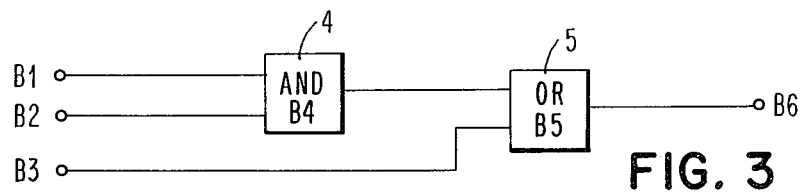
FIG. 3
LOGIC MODEL
| NAME | FUNCTION | INPUTS (WEIGHTS) | OUTPUTS | OUTPUT DISTANCE |
|------|----------|------------------|---------|-----------------|
| B1 | PI | | B4 | 6 |
| B2 | PI | | B4 | 5 |
| B3 | PI | | B5 | 4 |
| B4 | AND | B1(1) B2(2) | B5 | 3 |
| B5 | OR | B4(2) B3(1) | B6 | 2 |
| B6 | P.O. | B5(1) | | 1 |
FIG. 3A
LOGIC DATA FAULT LIST
| | | | | | | |
|---|---|---|---|---|---|---|
| F1 | 1ST. | INPUT | TO | BLOCK | B4 | STUCK 1 |
| F2 | 2ND. | INPUT | TO | BLOCK | B4 | STUCK 1 |
| F3 | 1ST. | INPUT | TO | BLOCK | B5 | STUCK 0 |
| F4 | 2ND. | INPUT | TO | BLOCK | B5 | STUCK 0 |
| F5 | | OUTPUT | OF | BLOCK | B5 | STUCK 1 |
| F6 | | OUTPUT | OF | BLOCK | B5 | STUCK 0 |
FIG. 3B

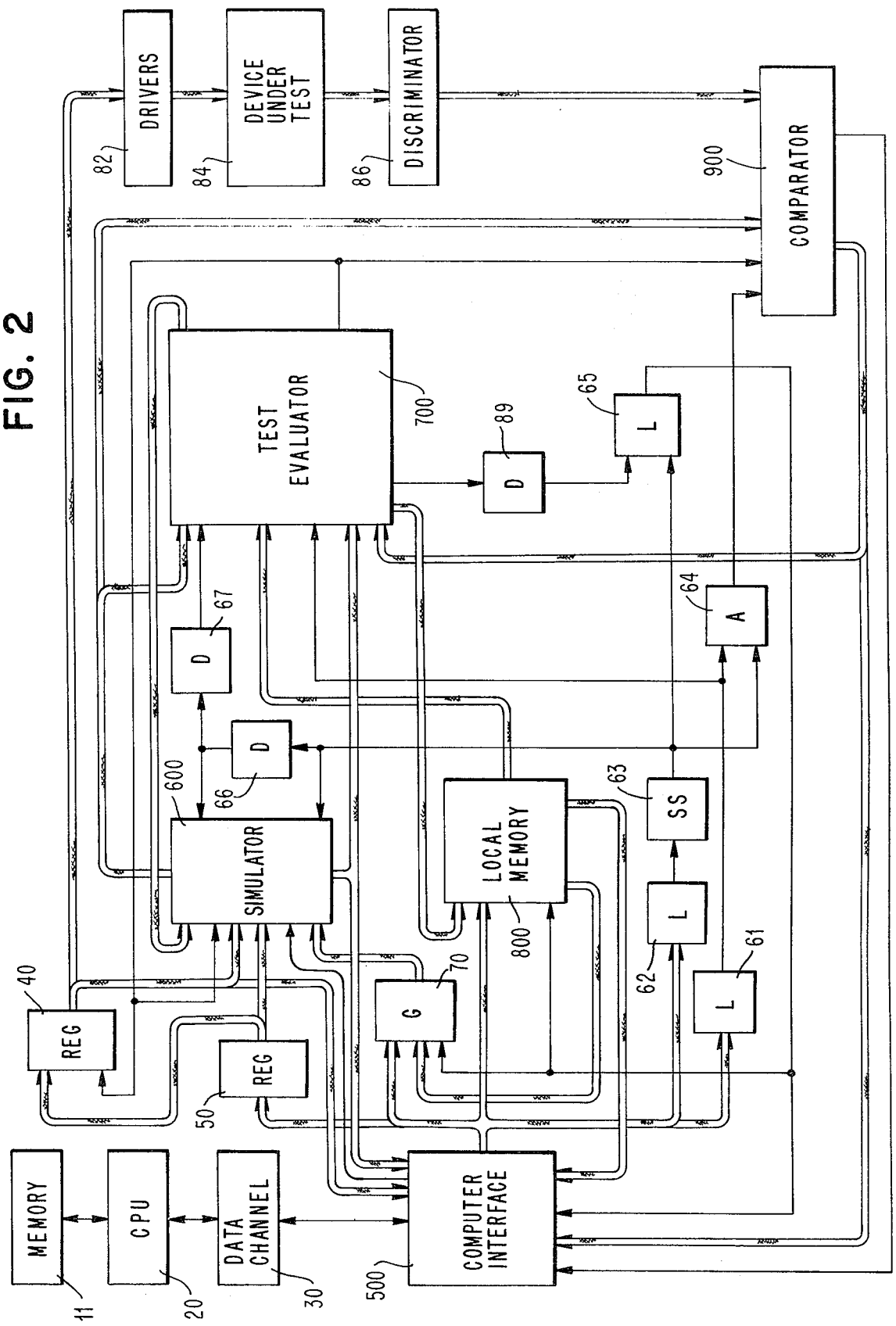

PATTERN 1

| | B1 | B2 | B3 | B4 | B5 | B6 | MACHINE |
|---|---|---|---|---|---|---|---|
| | 0 | 0 | 0 | 0 | 0 | 0 | GOOD |
| | 0 | 0 | 0 | 0 | 0 | 0 | F1 |
| | 0 | 0 | 0 | 0 | 0 | 0 | F2 |
| | 0 | 0 | 0 | 0 | 0 | 0 | F3 |
| | 0 | 0 | 0 | 0 | 0 | 0 | F4 |
| | 0 | 0 | 0 | 0 | 1 | 1 | F5 |
| | 0 | 0 | 0 | 0 | 0 | 0 | F6 |
| | 0 | 0 | 0 | | | 0 | D.U.T. |

FIG. 3C

PATTERN 2

| | B1 | B2 | B3 | B4 | B5 | B6 | MACHINE |
|---|---|---|---|---|---|---|---|
| | 0 | 1 | 0 | 0 | 0 | 0 | GOOD |
| | 0 | 1 | 0 | 1 | 1 | 1 | F1 |
| | 0 | 1 | 0 | 0 | 0 | 0 | F2 |
| | 0 | 1 | 0 | 0 | 0 | 0 | F3 |
| | 0 | 1 | 0 | 0 | 0 | 0 | F4 |
| | 0 | 1 | 0 | 0 | 0 | 0 | F6 |
| | 0 | 1 | 0 | | | 0 | D.U.T. |

FIG. 3D

PATTERN 3

| | B1 | B2 | B3 | B4 | B5 | B6 | MACHINE |
|---|---|---|---|---|---|---|---|
| | 0 | 0 | 0 | 0 | 0 | 0 | GOOD |
| | 0 | 0 | 0 | 0 | 0 | 0 | F2 |
| | 0 | 0 | 0 | 0 | 0 | 0 | F3 |
| | 0 | 0 | 0 | 0 | 0 | 0 | F4 |
| | 0 | 0 | 0 | 0 | 0 | 0 | F6 |
| | 0 | 0 | 0 | | | 0 | D.U.T. |

FIG. 3E

PATTERN 4

| | B1 | B2 | B3 | B4 | B5 | B6 | MACHINE |
|---|---|---|---|---|---|---|---|
| | 1 | 0 | 0 | 0 | 0 | 0 | GOOD |
| | 1 | 0 | 0 | 1 | 1 | 1 | F2 |
| | 1 | 0 | 0 | 0 | 0 | 0 | F3 |
| | 1 | 0 | 0 | 0 | 0 | 0 | F4 |
| | 1 | 0 | 0 | 0 | 0 | 0 | F6 |
| | 1 | 0 | 0 | | | 0 | D.U.T. |

FIG. 3F

PATTERN 5

| | B1 | B2 | B3 | B4 | B5 | B6 | MACHINE |
|---|---|---|---|---|---|---|---|
| | 1 | 1 | 0 | 1 | 1 | 1 | GOOD |
| | 1 | 1 | 0 | 1 | 0 | 0 | F3 |
| | 1 | 1 | 0 | 1 | 1 | 1 | F4 |
| | 1 | 1 | 0 | 1 | 0 | 0 | F6 |
| | 1 | 1 | 0 | | | 0 | D.U.T. |

FIG. 3G

PATTERN 6

| | B1 | B2 | B3 | B4 | B5 | B6 | MACHINE |
|---|---|---|---|---|---|---|---|
| | 1 | 1 | 1 | 1 | 1 | 1 | F3 |
| | 1 | 1 | 1 | 1 | 0 | 0 | F6 |
| | 1 | 1 | 1 | | | 1 | D.U.T. |

FIG. 3H

SIMULATOR

| TWO-BIT CODE | LOGIC VALUE |
| --- | --- |
| 11 | 0 |
| 10 | X |
| 00 | 1 |
FIG. 9
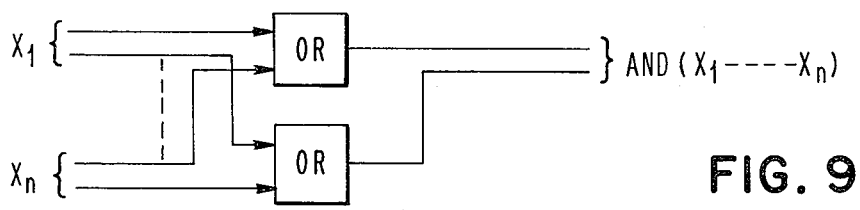
FIG. 9A
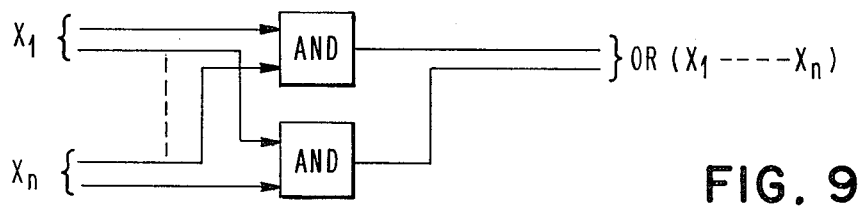
FIG. 9B
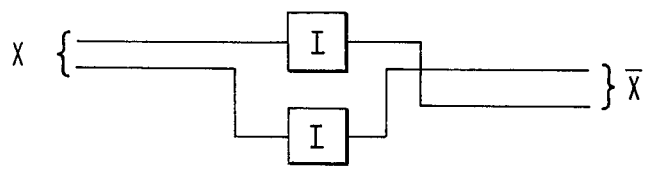
FIG. 9C
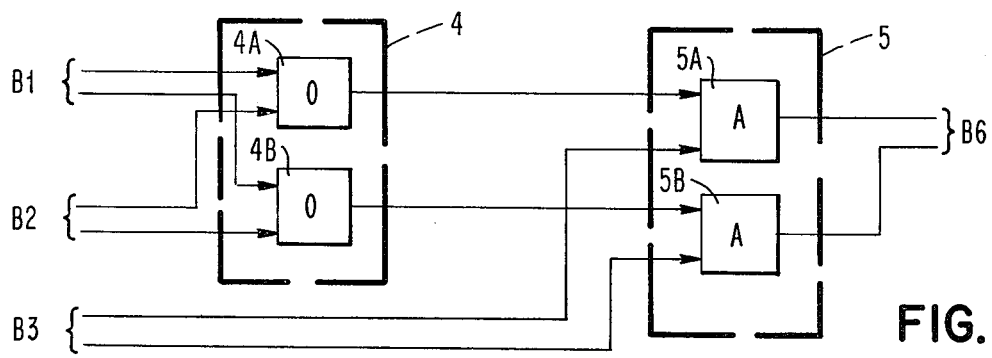
FIG. 10A
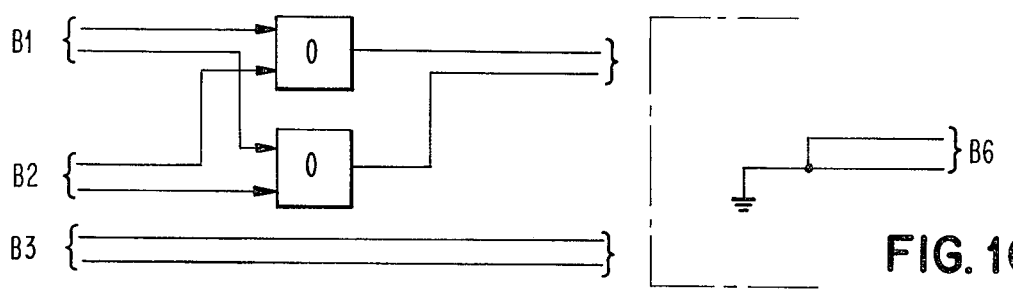
FIG. 10B

LOGIC NETWORK TEST SYSTEM WITH SIMULATOR ORIENTED FAULT TEST GENERATOR

CROSS REFERENCES TO RELATED APPLICATIONS AND PATENTS

1. Giedd et al U.S. Pat. 3,614,608 issued October 19, 1971, and assigned to the assignee of the present application.
2. Carpenter et al U.S. Pat. 3,719,885 issued March 6, 1973, and assigned to the assignee of the present application.
3. Heilweil et al U.S. Pat. 3,633,100 issued January 4, 1972, and assigned to the assignee of the present application.

BACKGROUND OF THE INVENTION

1. Field of the Invention

This invention relates to the testing of complex integrated logic networks and more particularly to a simulator oriented fault test generator for testing such complex integrated circuits.

2. Description of the Prior Art

It is well known that high circuit densities and low pin-to-circuit ratios which are characteristic of large scale integrated (LSI) logic design are causing logic modules to be more functional and harder to test. In the prior art a number of test generating techniques have been developed that work well when the input pattern sequence to test a particular fault is short. However, when a long imput pattern sequence is required in order to test for a particular fault, presently known techniques have significant shortcomings. For purposes of brevity, two broad classes of known test generating techniques are described in order to best illustrate that the present invention is a distinctly improved third technique.

A first technique for testing a circuit having inaccessible circuit nodes is by direct analysis. Direct analysis would work very well on the simplified exemplary circuit of FIG. 3, where one skilled in the art could apply the eight potential binary patterns to primary inputs B1, B2, and B3 and by observing the resultant output at primary output B6 draw conclusions about the condition of the network consisting of logic blocks 4 and 5. For a somewhat more complex circuit, this same analysis might be fruitfully performed with the calculations aided by a digital computer. Such a technique becomes increasingly cumbersome as the circuit becomes more complex and includes sequential as well as combinatorial logic circuits. Moreover, such testing is relatively time consuming. Particularly, as the sequential complexity increases, the derivation of binary test pattern sequences to fully test a circuit becomes prohibitively expensive.

In order to alleviate some of the problems associated with the first technique, the second technique of random testing was developed. This random test technique is fully described in the cross reference U.S. Patents to Giedd et al and Carpenter et al. Essentially, in the random technique, a statistically random test pattern (or weighted random test pattern) is applied to the primary inputs of a device under test as well as the primary input of either a "good" or a "simulated good" device. The outputs of these two circuits are compared on a real time basis and if no errors arise within a predetermined time, it may be assumed with some degree of certainty that the logic network under test operates correctly. A problem with random pattern testing is that it is not oriented towards detecting particular faults and thus time might be spent running unnecessary test input patterns. Another problem with random pattern testing is that tests are terminated arbitrarily, rather than after determining that all testable faults are found.

SUMMARY OF THE INVENTION

Accordingly, it is a primary object of this invention to test functional logic where long input pattern sequences are needed.

It is another object of this invention to test complex sequential logic circuits in an improved manner.

It is still another object of this invention to test complex functional logic circuits with an improved series of test patterns (test set) that is terminated when no particular test can be completed rather than terminating arbitrarily.

It is a still further object of this invention to generate an improved test set on a real time basis to diagnose failing logic blocks to a particular assumed fault.

In accordance with the present invention, sequential logic networks having a plurality of logic blocks having inputs and outputs at least some of said inputs and outputs being inaccessible within the sequential logic network are tested.

The network under test is simulated providing a threelevel simulated reference 620 (FIG. 7) in double rail logic. The actual double rail implementation of the example of FIG. 3 is illustrated in FIGS. 10A and 10B. Details of providing a three-level simulated reference are described herein and in the cross referenced Heilweil et al patent. The plurality of logic blocks and the inputs and outputs of these blocks which make up the network under test are uniquely identified in accordance with the logic model of FIG. 3A.

In order to set all the primary inputs to a known binary level, a first test pattern of binary valued signals is applied to the primary inputs of the simulated network. Such a pattern consisting of all zeros is shown for example at FIG. 3C. Next, a particular one of the plurality of logic blocks is selected and a specific fault associated with this logic block is assumed. Such an assumed fault is selected from the logic data fault list illustrated in FIG. 3B. Next, the actual binary value of the input to the particular one logic block (selected for the purposes of this test) caused by the first applied test pattern is determined. It is further determined whether the actual binary values of the inputs of the selected one logic block provide a test value for the assumed specific fault. A test value was previously defined as the binary value of a point within the logic network that is opposite from that expected in the absence of the assumed fault. The test value closest to the output is desired. This test value is then propagated through the network toward a primary output. Propagation of the test value through the network is performed by backtracing through the network to find particular desired changes to the test pattern of binary valued signals applied to the primary inputs. This generates a series of test patterns, each successive test pattern altering only one of the binary valued signals applied to the primary inputs. During these steps of propagating and backtracing, each input pattern change is evaluated and discarded if the test evaluator so determines. The operation of the test evaluator 700 (FIG. 2) and the basis of applying or discarding successive test patterns is described in greater detail hereinafter. The successive generated test patterns result in a series of test patterns (test set) which is applied to the actual logic network under test. By comparing the binary values of the primary outputs of the actual logic network under test with the primary outputs of the simulated logic network, it is determined whether the assumed specific fault exists in the actual logic network under test.

This process of applying successive test patterns to the simulated reference and actual network under test can take place on a real time basis and as long as the output pattern at the primary outputs of both the reference and actual network is the same, no faults are detected. However, when the output pattern indicates that faults are present in the logic under test, further analysis in accordance with the presently disclosed techniques is required. Accordingly. a particular pair of faults is assumed and the derived patterns for distinguishing those particular faults are applied to the primary inputs of the failing machine while monitoring the primary outputs. This procedure is repeated for other particular fault pairs until the primary output pattern indicates that a particular assumed fault and actual fault in the logic under test are the same.

The foregoing and other objects, features, and advantages of this invention will be apparent from the following more particular description of the preferred embodiment of the invention as illustrated in the accompanying drawings.

DESCRIPTION OF THE DRAWINGS

FIG. 1 is a functional block diagram of the overall test system.

FIG. 2 is a more detailed logic block diagram of the test system.

FIG. 3 is a combinatorial logic block diagram useful as a descriptive example.

FIG. 3A is a logic model useful in the exemplary description in the testing of the logic circuit of FIG. 3.

FIG. 3B is a fault list table useful in the exemplary description of the testing of the logic block diagram of FIG. 3.

FIGS. 3C through 3H are illustrative test patterns.

FIG. 9 is a table illustrating the relationship between two bit code and actual logic value.

FIGS. 9A, 9B, and 9C are double rail logic circuits for implementing logic functions in two bit code.

FIG. 10A is the double rail implementation of the logic circuit of FIG. 3.

FIG. 10B is the double rail logic implementation of the circuit of FIG. 10A with an assumed fault of the output terminal B6 (the output of OR circuit B5) stuck at 1.

GENERAL DESCRIPTION

Figure 4:
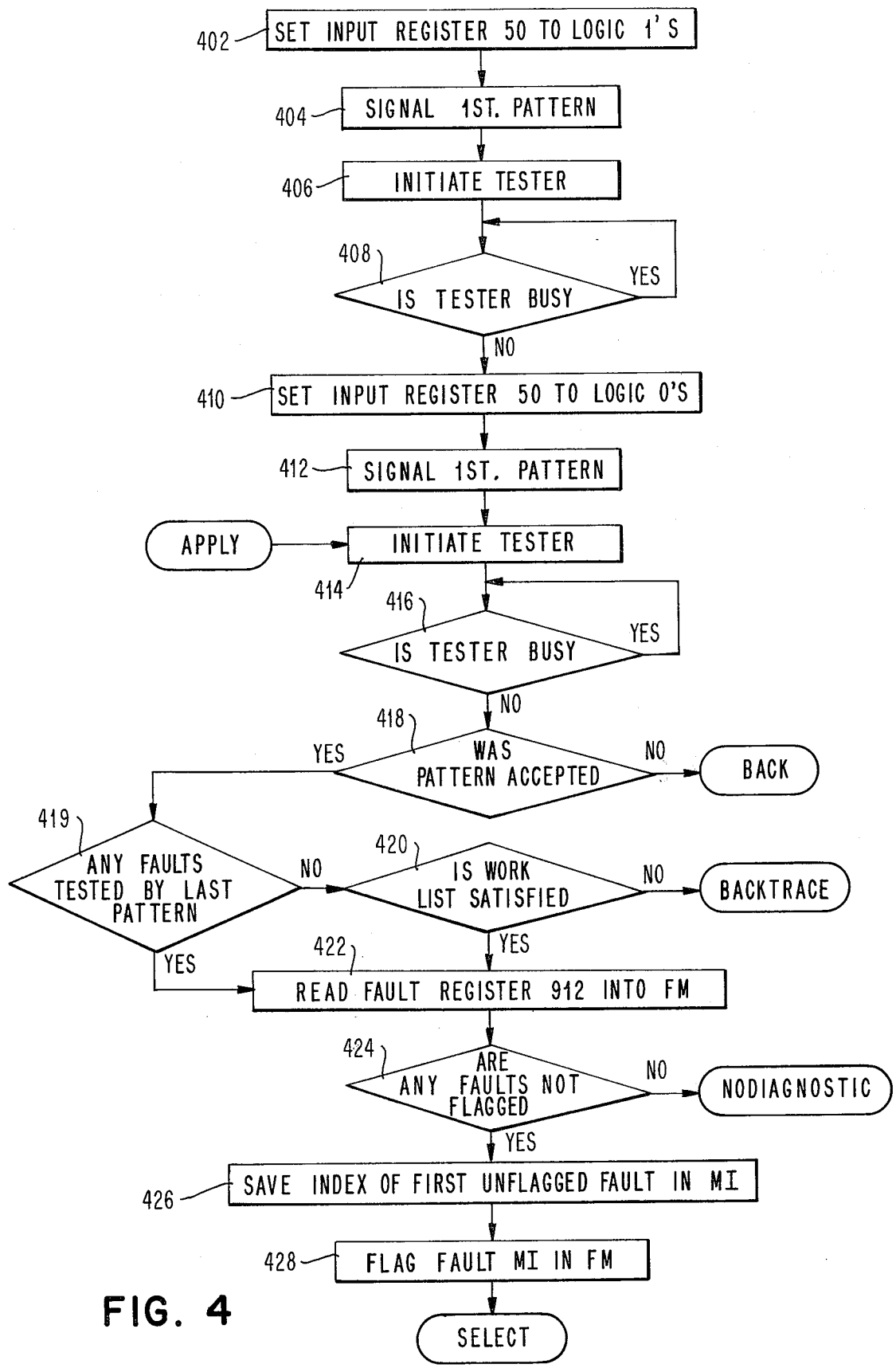
FIGS. 4, 5, 6, and 6A are flow diagrams describing the operation of the fault analyzer.
Figure 5:
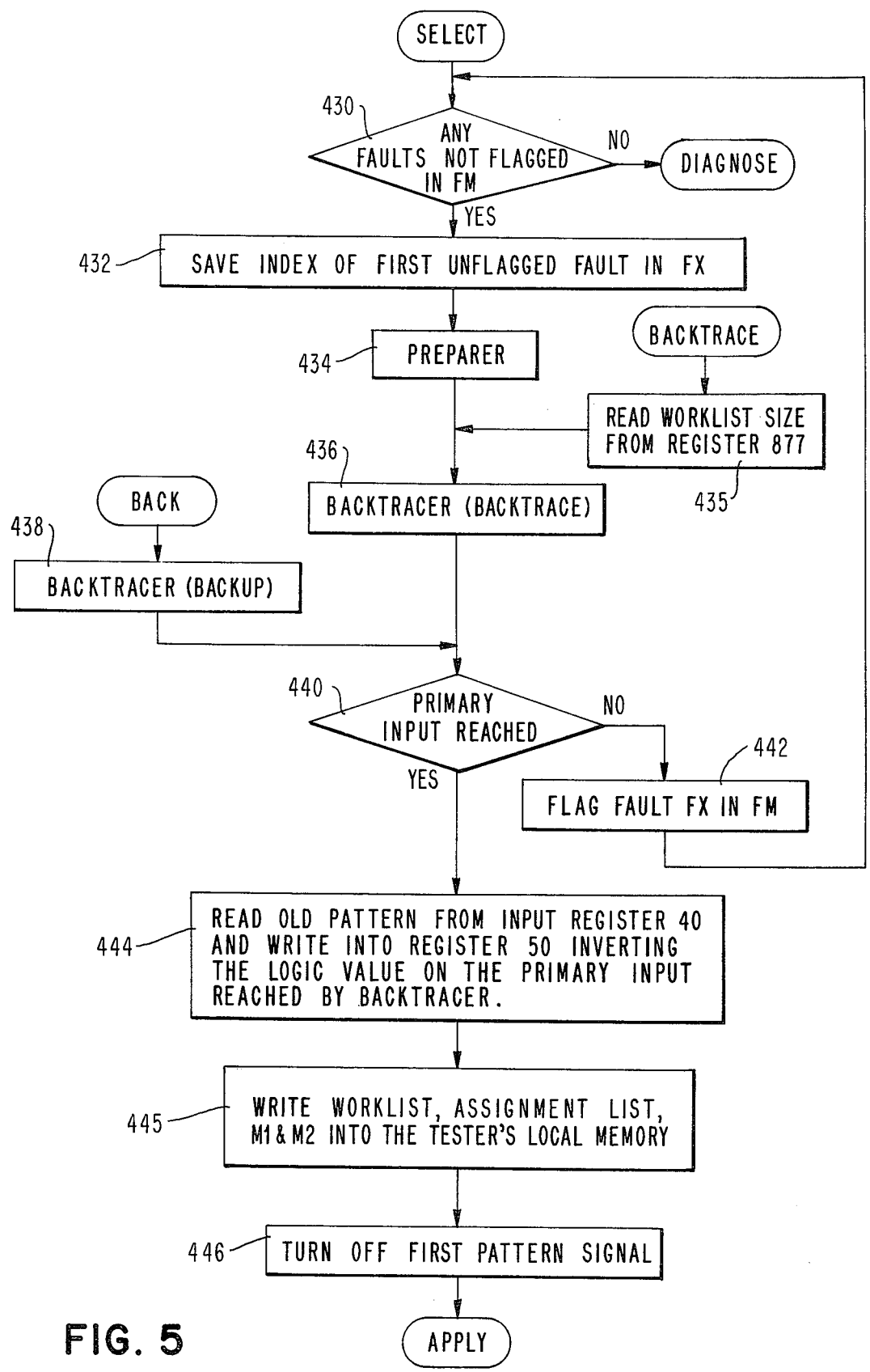

Refer now to FIG. 1 broadly setting forth the present invention. The logical and physical data 1 for a particular logic device under test (DUT), is stored in an electronic memory. Such a device under test, which is the logic network to be tested by the present invention, is typically a complex large scale integrated (LSI) logic circuit including sequential logic. This logical and physical data descriptive of the logic network and normally stored in the memory of a digital computer, is retrieved by the central processing unit (CPU) 2 of general purpose computer 2 and is utilized to perform the various arithmetic and logical calculations associated with the testing function. The computer 2 interfaces with a tester 10 which in turn exercises the logic network 12. The various structural relationships and functions are set forth in greater detail herein initially in FIG. 2 which is a more detailed block diagram of FIG. 1. However, before describing the overall structure and operation for the general case, it appears helpful to describe the present testing technique by way of a simplified specific example.

Accordingly, refer to FIGS. 3 and 3B for an illustrative example. FIG. 3 illustrates a simple combinational logic network which will be utilized as the device under test for the present example. AND circuit 4 receives inputs via terminals B1 and B2. The output of AND circuit 4 provides the first input to OR circuit 5. OR circuit 5 receives a second input via terminal B3 and provides an output via terminal B6. FIG. 3A is a logic model of the circuit of FIG. 3 describing the FIG. 3 circuit in machine readable form. In the left hand most column each of the terminals and logic blocks are listed in accordance with the labels in FIG. 3. In the second column the function of each of these logic blocks is also listed. In this simplified example, all of terminals B1, B2, and B3 are primary inputs designated as PI. AND circuit 4 and OR circuit 5 have their designated functions listed while terminal B6 is a primary output PO. The third column in FIG. 3A represents the inputs for each of the items listed in the first column. The primary inputs B1, B2, and B3, of course, have no further input designated and therefore are left blank in column 3 of FIG. 3. AND circuit 4 receives as its input B1 and B2 as shown in column 3. OR circuit B5 receives its input from B3 and B4. Output terminal B6 receives its input from B5 (which is OR circuit 5). Each of the inputs has a weight associated with it. Each weight is a function of the logic that drives that input and represents the relative order of difficulty of controlling the corresponding input. This is best illustrated by looking at the inputs to B5 which are B4 and B3. B3 is more easily controlled being a primary input than B4 which requires the operation of the logical AND gate 4. Thus, the input B4 to B5 receives a weight of 2 while the input B3 receives the weight of 1. Since terminal B6 only receives a single input it is assigned a weight of 1. The next column designates each of the outputs. The output of terminal B1 goes to AND circuit 4 and is designated as B4. The same is true for input terminal B2. The output of circuit B4 is B5 and the output of B5 is B6. Primary output B6 of course has no further output shown. The particular simplified diagram of FIG. 3 does not illustrate a fan out which is a condition wherein a particular logic block has more than one output. The last column illustrates output distance which is a unique number assigned to each block depending on its distance from the primary output. In the event of equal distance from the output, arbitrary output distances are assigned; however, each block has an output with an output distance number lower than its own output distance number. Thus, AND circuit 4 (block 4) has an output distance of 3 while OR circuit 5 being the output of AND circuit 4 has an output distance number of 2. In the simulation of the network under test, the foregoing describes the identification of the logic blocks and the inputs and outputs of each of the blocks.

Referring to FIG. 3B, an assumed fault list is shown for the simple illustrative network of FIG. 3. The illustrated list is self-explanatory. For example, F1 refers to the first input to block B4 being stuck at a binary 1. This example fault list includes all unique stuck type faults for the present example network. For the purposes of the present example, the D.U.T. has the specific fault F3, that is, the first input to OR circuit 5 is stuck at a binary zero. FIG. 3C shows a table comprised of columns identified by the names of all the logic points in the FIG. 3 device under test. Rows in the table correspond to simulated "machines" each of which is either the "good machine" or a "failing machine" having one of the faults F1-F6 listed in FIG. 3B. By way of example, a suitable test pattern is generated on a real time basis, so that the D.U.T. is also listed as a "machine". As an initialization step in the pattern generation, a first test pattern of binary valued signals such as the all zeros pattern illustrated in FIG. 3C is applied to the primary inputs. Applying all zeros to the primary inputs provides a zero at B4, B5, and B6 in the good machine. It is noted that all the binary block values for the F1 machine are also zero as shown in the second line of the table of FIG. 3C. The same is true for faults F2, F3, F4, and F6. However, fault F5 which provides that the output of block B5 is stuck at 1 causes both B5 and the output terminal B6 to be at a logical 1 in response to an all zero pattern. This indicates the presence of a test value at B5 and a test at B6. In the present example, the input pattern of all zeros applied to the simulated logic under test therefore provides the outputs as shown in column B6 of FIG. 3C. The same pattern applied to the actual device under test of FIG. 3 which was said to have fault F3 also produces a zero output at terminal B6. From this it is seen that this all zero pattern can detect fault F5 and that the fault F5, is not present in this device under test.

It is next desired to apply pattern number 2 as shown in FIG. 3D to the primary inputs B1, B2, and B3. In accordance with the present invention, the fault analyzer determines that the next comparison to be made is between the good machine and the F1 machine. The F1 machine was previously defined as a failure in which the first input to block B4 is stuck at 1. The preparer routine described herein determines that to test for a stuck 1 condition at the first input of B4, it is necessary to apply a zero to terminal B1. It also notes that a zero already exists at that terminal from pattern 1. It further notes that for the good machine a zero at terminal B1 will produce a zero at B4, the output of AND circuit 4. However, in order to test for a stuck 1 at the first input to block B4 a 1 output from AND circuit 4 is required on the failing model of the machine while the zero output from AND circuit 4 is required for the good machine. In order to obtain a desired 1 at the output of B4, the backtracer routine of the present invention described in greater detail hereinafter, determines that a 1 input is required at terminal B2. Since pattern 1 has a zero at B2, pattern 2 now requires a 1 at terminal B2. Since only one of the input values is changed in successive patterns, the input terminals B1 and B3 remain at zero. This new pattern is not shown being applied to machine F5 since the all zero pattern was already found to detect fault F5 and F5 has been eliminated from consideration as the fault present in the device under test. Referring again to FIG. 3D it is noted that pattern 2 detects failing machine F1. However, since the device under test (DUT) has a zero output at the primary output B6, it is found that fault F1 is not present either.

Refer now to FIG. 3E illustrating pattern 3. Before pattern 3 is generated and applied the fault analyzer, described in greater detail hereinafter, determines that the good machine in greater detail hereinafter, determines that the good machine and machine F2 are next to be compared. It is known that F2 is assumed to be a fault such that the second input to block B4 is stuck at 1. By the same analysis described in the foregoing paragraph, the preparer routine notes that in order to test for such a stuck condition the input to terminal B2 must be a binary zero. Since pattern 2 applied a binary 1 to terminal B2, it is now changed to a zero. Again, only this one change is permitted at a primary input when progressing from one pattern to the next. Applying this all zeros pattern to the primary inputs produces no test values since all remaining machines (good and failing) produce the identical results. It is again noted that the results for machine F5 and F1 are ignored, these machines having been eliminated from consideration by previously applied patterns.

Refer now to FIG. 3F in which pattern 4 is applied. The preparer again notes that in order to test for fault F2 a zero is required at terminal B2. This already exists from pattern 3. Next the preparer determines that in the failing condition a 1 is required at the output of B4. The backtracer routine determines that in order to obtain a 1 at the output of B4 a 1 is required at terminal B1. The input pattern is altered accordingly as shown in FIG. 3F. The resultant pattern shows that there is a distinction between the good machine and F2 machine such that this pattern is satisfactory for testing for an F2 failing machine. However, the device under test has zero on terminal B6 indicating that fault F2 is not present in the actual device under test.

Refer now to FIG. 3G illustrating the application of pattern number 5. The fault analyzer determines that the next comparison is between the good machine and F3. F3 was defined as the first input to block B5 being stuck at zero. The preparer routine determines that in order to test for a stuck zero at the first input of B5, a 1 must be applied. This requires a 1 at the output of B4. At this point the backtracer routine determines that in order to have a 1 output from block B4 both terminals B1 and B2 must have a 1 applied there too. Terminal B1 already has a 1 applied from the previous pattern.

thus the required pattern change is that a 1 also be applied to terminal B2. It is here pointed out that if B2 were not a primary input, the backtracing would have to continue until a primary input were reached. It is also recognized that if this were a more complex circuit including sequential circuits this example would be significantly more complex as will become apparent from the more general description hereinafter. Applying the new pattern as illustrated in FIG. 3G shows that this pattern produces a test value and detects faults F3 and F6 which differ in their output from the good machine. It is also noted at this point that the assumed device under test has an output different from the good machine indicating that it has either fault F3 or fault F6. In order to further diagnose whether the device under test includes F3 or F6, a further pattern number 6 as illustrated in FIG. 3H must be applied. Since it is known from pattern 5 that either machine F3 or machine F6 is present, those are the two machines to be compared by pattern 6. It is known that machine F6 is the condition in which the output of block B5 is stuck at zero. Therefore, a pattern for distinguishing F3 from F6 must produce a 1 at B6 in order to detect a failing condition F3. The backtracer routine determines that in order to have a 1 at B6, a 1 input is required at terminal B3, because the input from B4 is assumed stuck at 0. Since pattern 5 had a zero at B3, pattern 6 is altered to have a 1 applied at terminal B3. The results in FIG. 3H show that this pattern separates the machines F3 and F6 and the assumed device under test is illustrated to show that it in fact has fault F3. The fault analyzer notes that there are no more machines to be compared and this test result is therefore printed out. Although the present example relates to stuck faults, the present invention is capable of detecting any kind of fault that can be simulated. The foregoing simplified description should be kept in mind during the following more generalized but more detailed description of the structure and operation of the present invention.

Refer now to FIG. 2 illustrating a generalized block diagram of the present test system. Memory 11 is a standard electronic memory system as well as known in the art and in the present case is loaded with the necessary data including the logic description of the device under test, the fault list, program code and other information required by the test generator and fault analyzer. Memory 11 operates in conjunction with CPU 20 in a manner well known to those skilled in the art. CPU 20 and memory 11 may for example be embodied as a digital computer IBM 370 model 135. Including its normal capabilities, CPU 20 has the capacity to perform the instructions herein specified for the preparer, fault analyzer, backtracer, and backer routines. Data channel 30 is a conventional data channel connected between CPU 20 and computer interface 500. Computer interface 500 includes the necessary circuitry such as data registers, address decoders, etc., to provide the information from the CPU to register 50, gate 70, local memory 800, and latches 61 and 62. Computer interface 500 also routes to the CPU 20 the appropriate signals from register 40, simulator 600, local memory 800, latch 65, and comparator 900. Computer interface 500 also provides the necessary clocking signals to register 50, gate 70, local memory 800, and latches 61 and 62. Such clocking lines are not separately shown in FIG. 2 for ease of explanation and since they are conventional.

Figure 13:
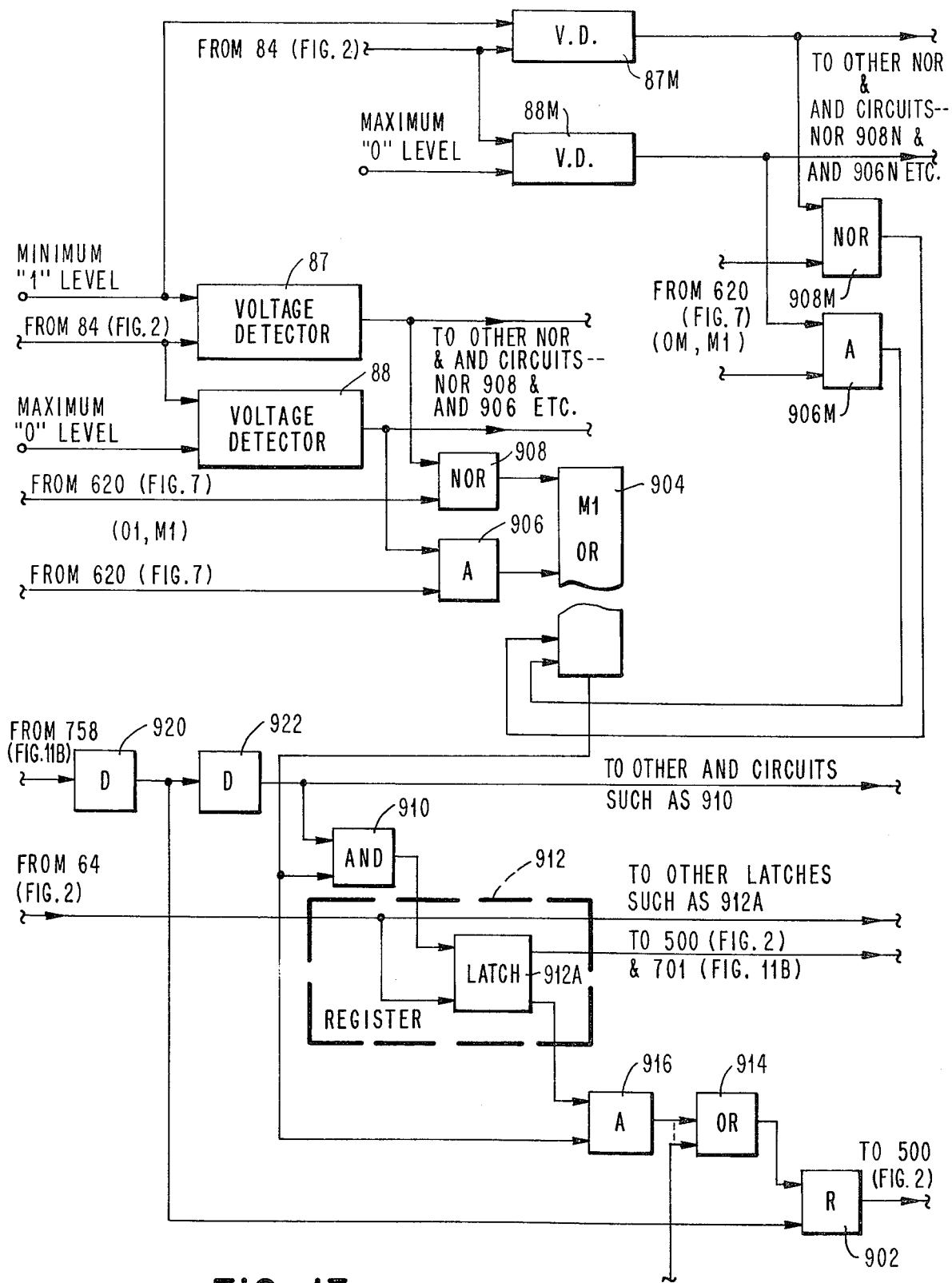
FIG. 13 is a more detailed logic diagram illustrating the test discriminator 86 and comparator 900 of FIG. 2 in greater detail.

Register 50 is a standard electronic register receiving input test patterns from computer interface 500 and has a capacity sufficient to hold all the bit positions for one pattern to be applied to device under test 84. Register 50 supplies the input pattern to both register 40 and simulator 600. Register 40 in response to a clock signal from test evaluator 700 supplies this test pattern to drivers 82. Drivers 82 are standard driver circuits as required by the particular device being tested. The output of register 40 is also connected to the input of simulator 600 and to computer interface 500. As explained later herein the patterns stored in registers 40 and 50 are not necessarily the same pattern. Computer interface 500 also provides a logic block address signal through gate 70 to simulator 600. Gate 70 connects either computer interface 500 or local memory 800 to simulator 600 depending on the gating signal from latch 65. Computer interface 500 also provides an input to latches 61 and 62. Computer interface 500 changes the state of latch 62 from a zero to a 1 when it is desired to initiate tester operations. This logical 1 is transferred to single-shot 63 which provides an input to simulator 600, delay circuit 66, latch 65 and AND circuit 64. The state of latch 61 also controlled by computer interface 500 is set to a logical 1 if this is the first pattern to be applied to the device under test 84. If both inputs to AND circuit 64 are logical 1, then the output supplies a reset pulse to comparator 900. Simulator 600 is described in greater detail in FIG. 7. Local memory 800 is described in greater detail in FIG. 11A. Delay 66 also receiving a start pulse from single-shot 63 supplies a delayed start pulse to simulator 600 and and even further delayed pulse to test evaluator 700 through delay circuit 67. Test evaluator 700 also receives inputs from simulator 600, local memory 800, latch 61, and comparator 900. A first input to test evaluator 700 from simulator 600 provides all the double rail primary output signals from the simulated machines. This same signal is supplied as an input to comparator 900. A second signal from simulator 600 to test evaluator 700 provides any selected double rail signal relating to a particular block within a particular simulated failing machine. The same signal is also applied to computer interface 500. The details of the signals from local memory 800 will be described in greater detail in the description of FIG. 11A. The test evaluator 700 also receives a signal from latch 61 indicating the first pattern for the particular device under test. Lastly, the test evaluator 700 receives a signal from comparator 900 indicating which machines are still under consideration. Test evaluator 700 provides an output signal to comparator 900 indicating that the pattern has been accepted and applied to the device under test. This signal is also applied to register 40 and simulator 600. Test evaluator 700 also provides a further output to simulator 600 indicating that the pattern in register 50 has been rejected and that the pattern from register 40 should be brought into the simulator to restore the simulator to its previous state. A further output of test evaluator 700 provided to simulator 600 gates the information from gate 70 into the simulator. An output from test evaluator 700 to delay circuit 89 sets latch 65 to a zero level indicating to the computer interface, gate 70, and local memory 800 that the tester operation has completed for this pattern. Computer interface 500 receives as a further input the output of local memory 800 providing information related to the disposition of the test. Computer interface 500 also receives inputs from comparator 900 indicating which machines are still under consideration and indicating whether the last test eliminated any machines from consideration. Device under test 84 receiving the test pattern from drivers 82 at its primary inputs provides an output on its primary output to discriminator 86. Discriminator 86 provides analog voltage detection and provides the resultant digital signals to comparator 900 for comparing this signal with the signals from simulator 600 representing the primary outputs of the simulated machines. The details of discriminator 86 and comparator 900 are shown in FIG. 13.

Figure 7:
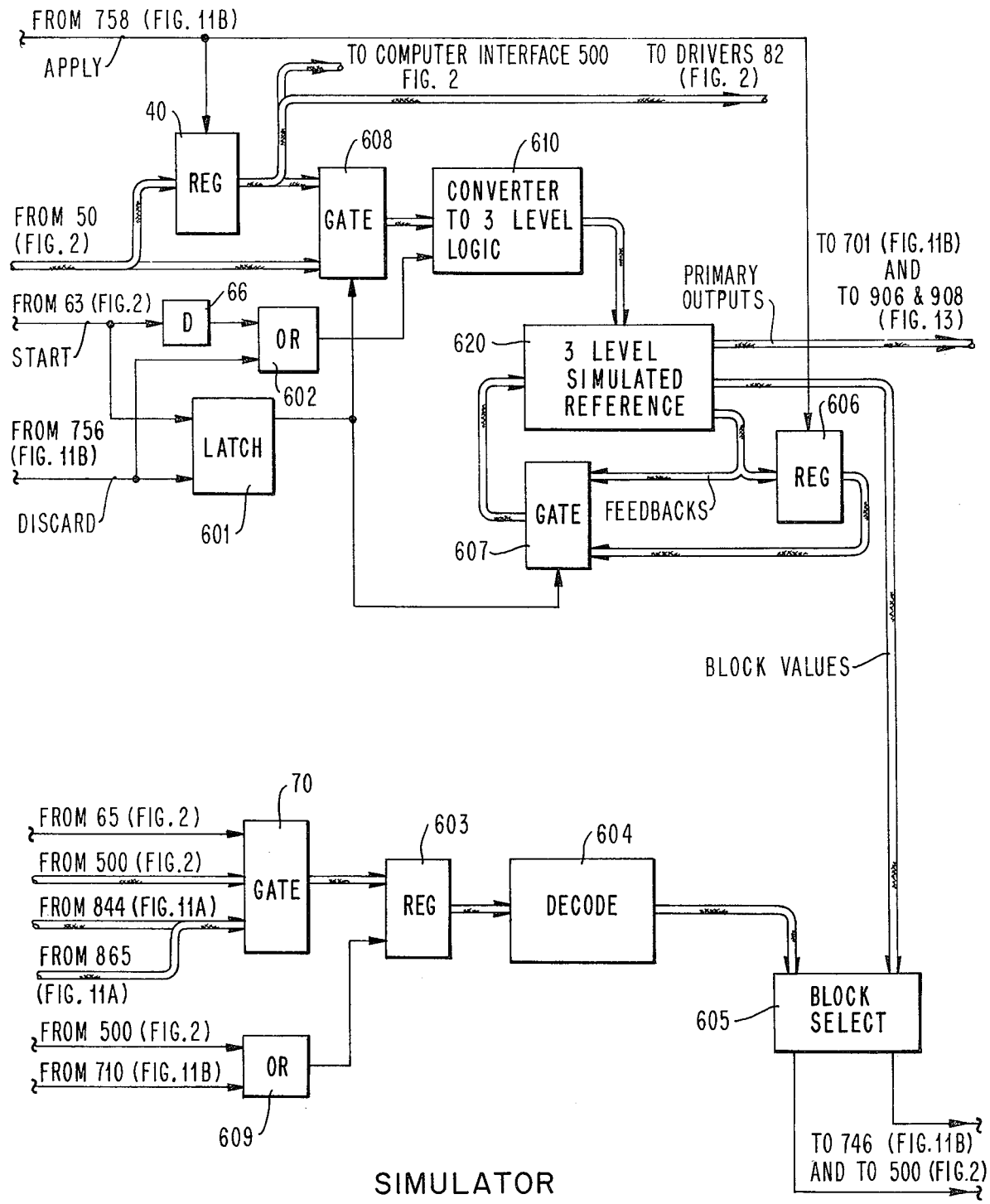
FIG. 7 is a logic block diagram of the simulator.
Figure 11B:
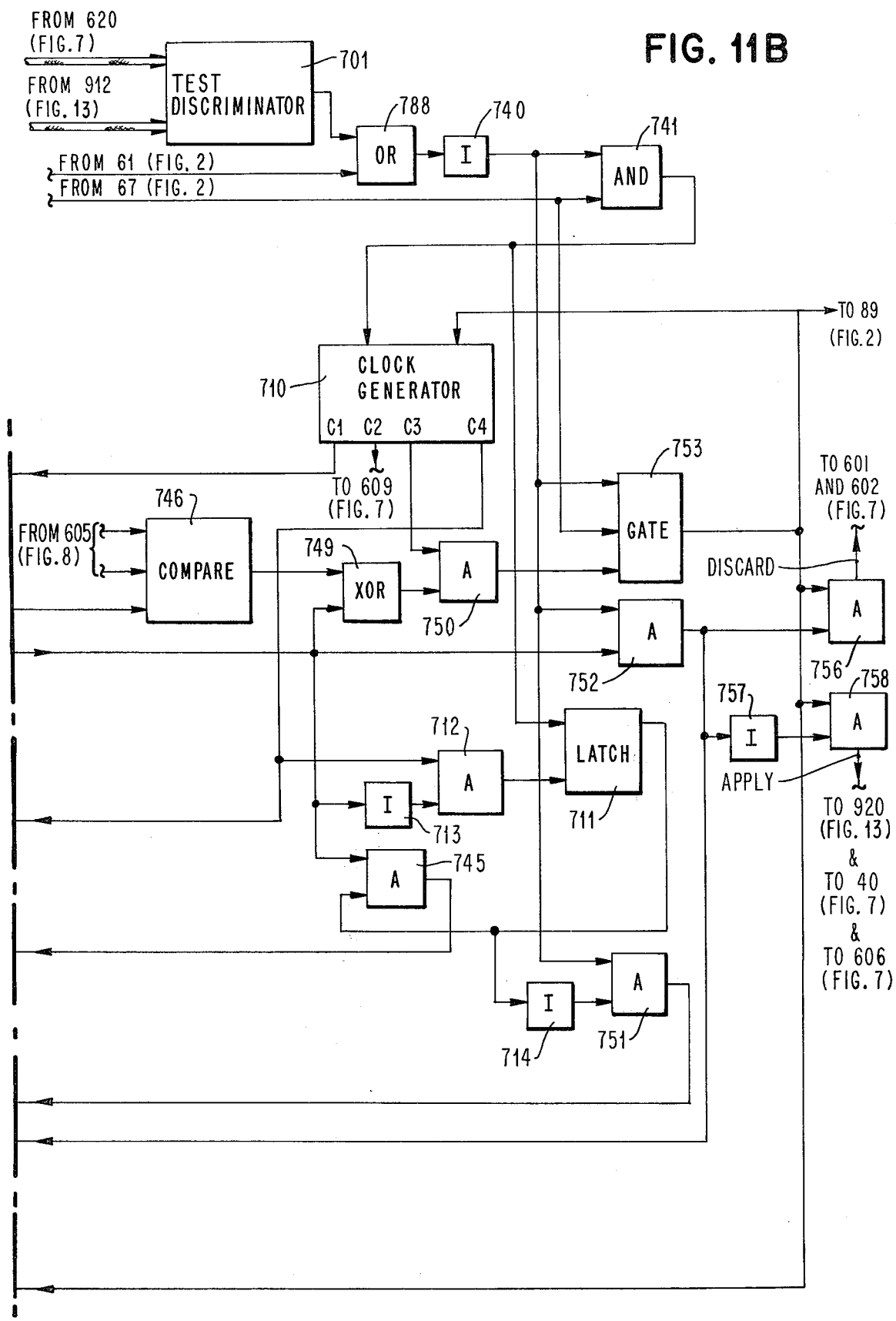
FIG. 11B is a more detailed logic diagram of the test evaluator showing the test evaluator 700 of FIG. 2 in greater detail.
Figure 11C:
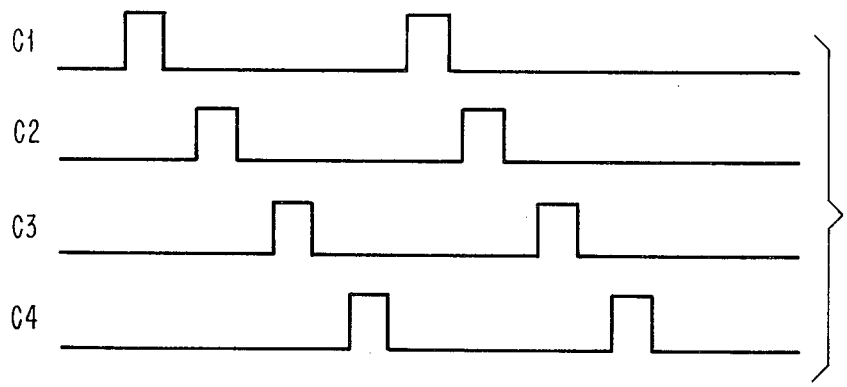
FIG. 11C is a waveform diagram depicting the operation of clock generator 710 in FIG. 11B.
Figure 11A:
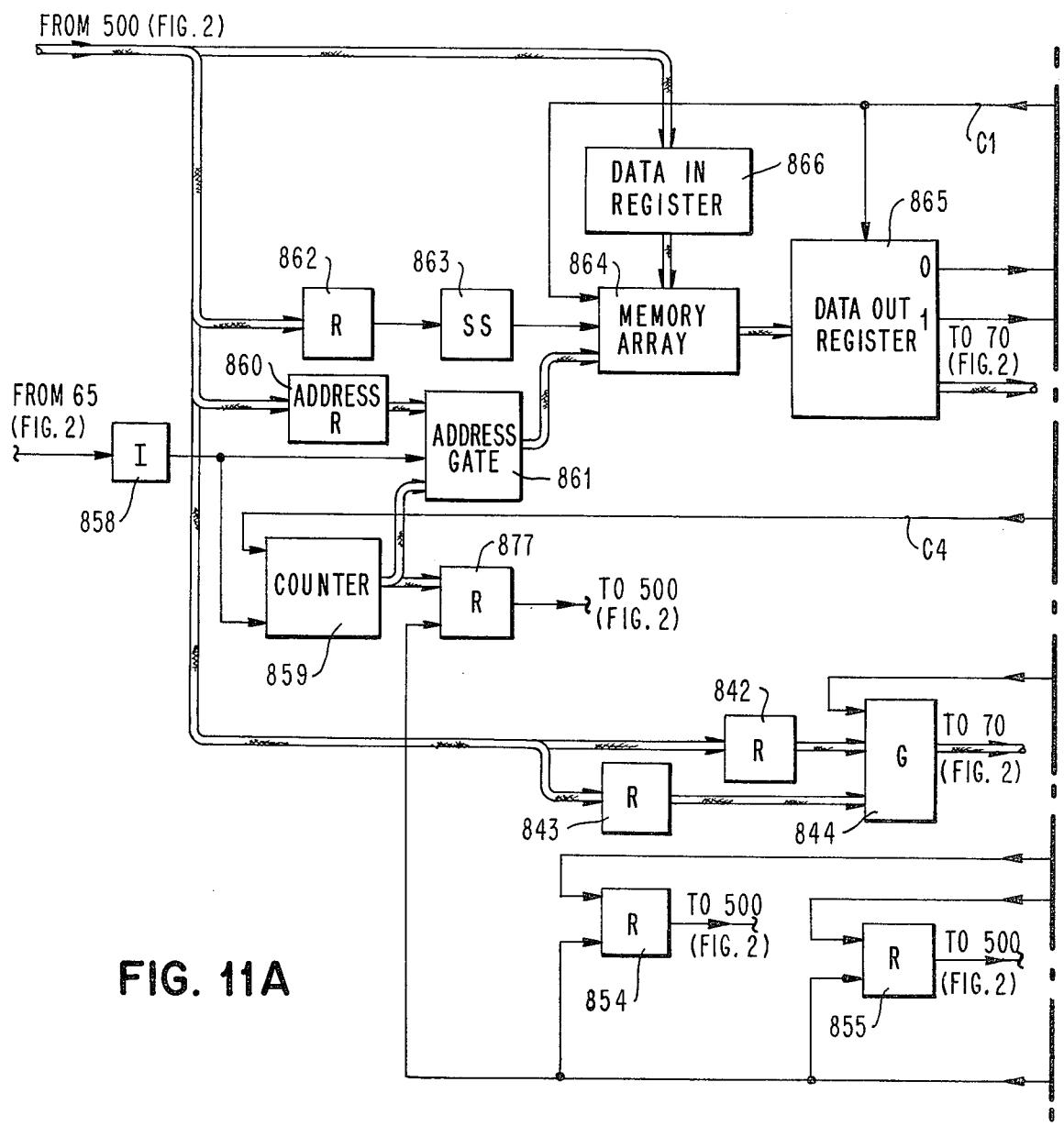
FIG. 11A is a logic block diagram of the logic memory showing local memory 800 of FIG. 2 in greater detail.

Refer now to FIG. 7 for a more detailed block diagram of the simulator 600 of FIG. 2. Also shown in FIG. 7 in addition to simulator 600 are register 40, delay circuit 66, and gate 70. An "apply" signal is received from the test evaluator (FIG. 11B) into register 40 and register 606. This gates the input pattern from register 50 (FIG. 2) into register 40 and also gates the "feedback states" output of simulated reference 620 into register 606. The input from register 50 (FIG. 2) is also applied to gate 608. A start pulse from single-shot 63 (FIG. 2) applies a start pulse to delay circuit 66 and latch 601. A discard input is received from the test evaluator (FIG. 11B) into latch 601 and OR circuit 602. The start input and discard inputs are mutually exclusive. Normally, a start pulse occurs at the beginning of each test. The start pulse sets latch 601 providing an output to gate 608 gating the input pattern from register 50 into converter 610. Converter 610 provides an output to the simulated reference 620. The delayed start pulse applied through delay 66 and OR circuit 602 is applied to converter 610 whereby the actual value of the input pattern from register 50 is applied to the simulated reference 620. After each start pulse, either a discard or an apply pulse, is subsequently applied to the simulator. The apply and discard signals are also mutually exclusive. In the event a discard pulse is received from the test evaluator (FIG. 11B) it is applied to OR circuit 602 and to the reset input of latch 601 and performs a similar function as was performed by the start pulse. Three level simulated reference 620 includes the double rail logic implementation of all the machines under consideration. Signal loops normally found within simulated reference 620 have been brought out as a feedback path through gate 607 so that simulated reference 620 is essentially a combinatorial logic network. In response to the input pattern (which is in double rail logic from converter 610) simulated reference 620 provides a number of outputs. A first output provides the double rail primary output values to test evaluator 700 and comparator 900 (FIG. 2). A second output provides all the double rail block values to block select 605. Block select 605 is described in greater detail in FIG. 8. Another output of simulated reference 620 provides the double-rail feedback values to register 606 in response to an apply signal. The output of latch 601 applied to gate 607 determines whether the feedback signal path or the contents of register 606 are gated to the simulated reference 620. When latch 601 is set by the start pulse, gate 607 connects the feedback outputs of simulated reference 620 directly to the feedback inputs of simulated reference 620. Conversely, when latch 601 is reset by the discard pulse, gate 607 connects the feedback inputs of simulated reference 620 to register 606. The simulator includes read-out circuitry consisting of gate 70, OR circuit 609, register 603, decode 604, and block select 605 which will now be described. Gate 70 receives a 1-level input from latch 65 (FIG. 2) when the tester is active. Gate 70 also receives an input from computer interface 500 providing block and machine identification. Gate 70 also receives a machine number input from gate 844 and block number input from data out register 865 in the local memory (FIG. 11A). The gating signal from latch 65 determines which of the signals (either from 500 or from 844/865) is to be applied to register 603. OR circuit 609 receives a clock input from computer interface 500 (FIG. 2) and from clock generator 710 (FIG. 11B). The output of gate 70 is applied to register 603 in response to either clock signal passing through OR 609. The output of register 603 is applied to decode 604 which has outputs to block select 605.

Figure 8:
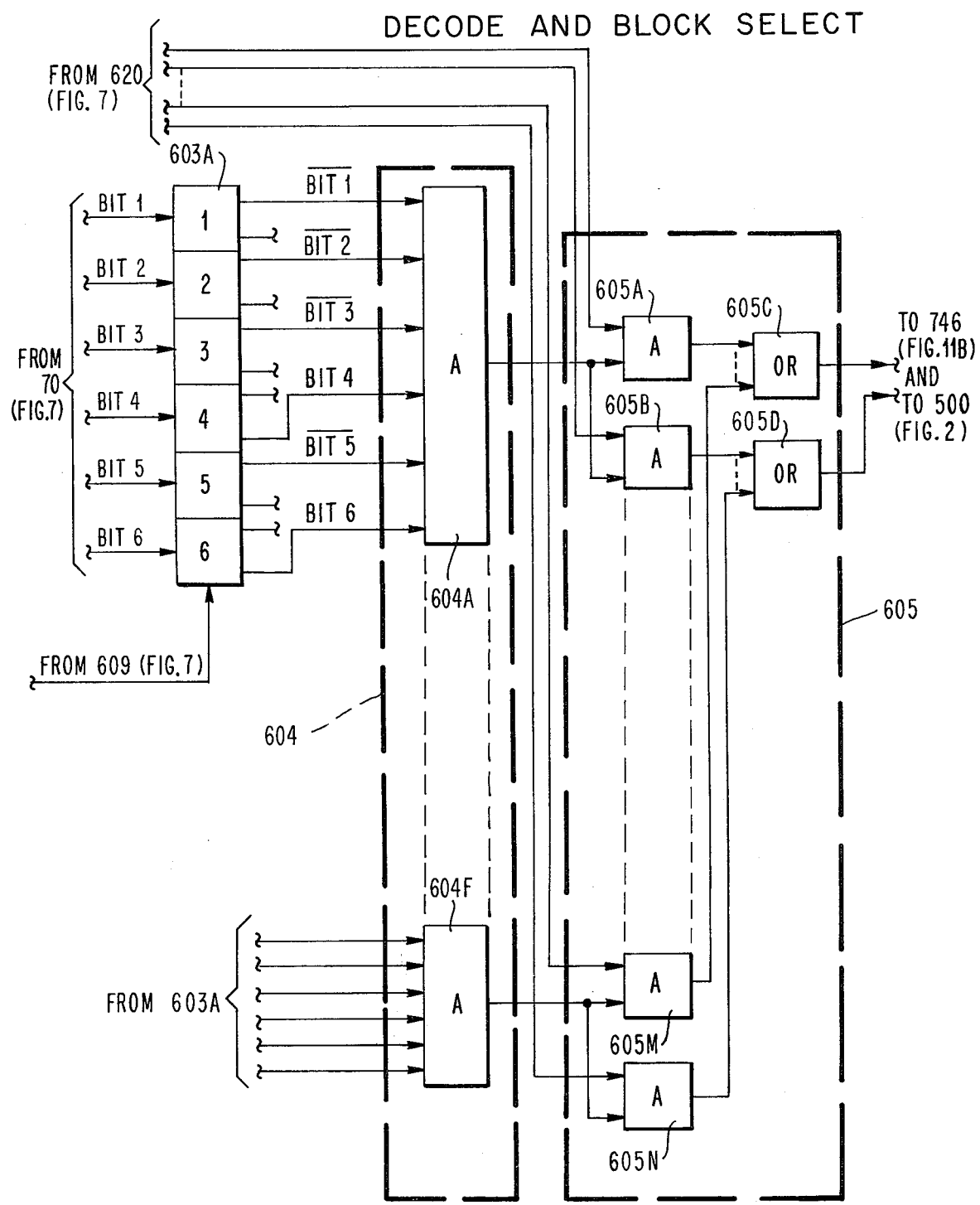
FIG. 8 is a logic block diagram showing a register, decode, and block select circuit from the simulator of FIG. 7.

The details of decode 604 and block select 605 are shown in FIG. 8 to which latter figure reference should now be made. The reference numerals have been maintained consistent with FIG. 7 insofar as practical. Register 603 has been represented as a 6 bit register 603A. This is by way of example as the length of the register is determined by the number of blocks and machines to be decoded. Referring momentarily to pattern 1 in FIG. 3C 6 blocks and 7 machines are represented in the simulator, the logical value of any of which may be selected. As shown in FIG. 3C, this requires 42 positions. It is known that a 6 bit register would have the capacity to decode 64 positions so that register 603A as shown would be ample for the 42 positions. In the present example bit 1 is considered the high order bit while bit 6 is the low order bit. Thus, the 6 legged AND circuit 604A would produce a 1-level output in response to machine-block address 000101, as shown. In the illustrative example of FIG. 8, 42 AND circuits 604A to 604F would be required each receiving a different combination of inputs from register 603A. Thus, only one of these AND circuits 604A through 604F would have an output depending on the particular pattern in register 603A. This output would be passed from AND circuit 604A to AND circuits 605A and 605B. Each of the AND circuits 604A through 604F feed their outputs to a pair of AND circuits thus AND circuit 604F provides an output to AND circuit 605M and 605N. AND circuits 605A and 605B also receive an input pair from simulated reference 620 (FIG. 7). Each of the signal pairs from simulated reference 620 represents a block value in double rail form. Since the output of simulated reference 620 is in double rail logic, the two lines are required to convey the representation of one block. The value of a different block is received into other AND circuits 605A through 605N. Thus, a different block value is received into AND circuits 605M and 605N as shown. Each of the AND circuits such as 605A and 605M have an input to OR circuit 605C while each of AND circuits 605B to 605N have an input to OR circuit 605D. A pair of outputs, one signal from OR circuit 605C and another from OR circuit from 605D are a double rail logic representation of the value of the particular selected block. The outputs of these latter OR circuits representing the output of block select 605 are inputted to both compare circuit 746 (FIG. 11B) and computer interface 500 (FIG. 2). An example of the double rail logic output of block select 605 is shown in FIG. 9. FIG. 9 shows 3 sets of two-bit code and their equivalent logic values. In order to implement a logic function in the particular two bit code to logic value conversion illustrated in FIG. 9, circuits such as illustrated in FIGS. 9A, 9B, and 9C are required. Referring first to FIG. 9A, in order to implement an AND function two OR circuits connected as shown are required. Thus, for example, if any pair of inputs to the OR circuits shown are both at a 1 level representing an input logic value of 0, the output lines will be at a 1 level representing a logic output value of zero. Each OR circuit can receive any number of inputs X1 through XN. The top one of the two inputs will always go into the top OR circuit while the bottom one of the two inputs will always go into the bottom OR circuit. Referring now to FIG. 9B, the implementation of an OR function is achieved by two AND circuits connected as shown. Referring to FIG. 9C, an invert function is accomplished by two parallel invert circuits with their outputs crossed as shown.

With the foregoing conversion of FIG. 9 from two bit codes to actual logic values in mind, refer now to FIG. 10A which illustrates the exemplary circuit of FIG. 3 in double rail logic. Fig. 10A represents the simulation of the FIG. 3 circuit as it would appear in simulator 620 of FIG. 7. Thus, the AND function of AND circuit 4 is represented by OR circuits 4A and 4B connected as shown while the OR function of OR circuit 5 is represented by AND circuits 5A and 5B connected as shown. FIG. 10B illustrates the representation of a particular selected fault in the simulated logic of FIG. 10A. The particular fault simulated in FIG. 10B is that the output of block 5 is stuck at a logical 1. This is represented by the configuration of FIG. 10B in which the output lines B6 are connected to ground while the primary inputs B3 are unconnected. The outputs of the OR circuits are also unconnected in the simulation of this particular fault but still being connected to block select 605 (FIG. 7) as are all blocks in the simulated reference 620.

Refer now to FIG. 11A which shows local memory 800 of FIG. 2 in greater detail. FIG. 11A receives an input from computer interface 500 into register 862, register 860, register 842, register 843, and data-in register 866. A second input is received from latch 65 (FIG. 2) into invert circuit 858. Because of the interaction between local memory 800 and test evaluator 700, test evaluator 700 has been shown in greater detail in FIG. 11B. The interconnecting lines between local memory 800 and test evaluator 700 are shown along the interface line of each of the two figures. FIGS. 11A and 11B should therefore be considered together and will be described as such. The test evaluator of FIG. 11B receives two inputs into test discriminator 701, the first input from simulator 620 (FIG. 7) and a second input from register 912 (FIG. 13). OR circuit receives recieves an input from latch 61 (FIG. 2) and AND circuit 741 receives an input from delay circuit 67 (FIG. 2). All other inputs/outputs of the local memory and test evaluator are along the interface line between FIGS. 11A and 11B. The CPU 20 (FIG. 2) through computer interface 500 (FIG. 2) loads data into memory array 864 through data-in register 866. The address from computer interface 500 is provided through address register 860 and address gate 861 when it is desired to load the memory array 864 from the CPU. The actual writing into an address of memory array 864 through address register 860 and address gate 861 is controlled by a pulse from computer interface 500 through register 862 and single shot 863 to memory array 864. In the alternative, a 1-level signal from latch 65 (FIG. 2) into inverter 858 gates the address in counter 859 into address gate 861 during tester operation. When the tester is inactive, a 1-level signal from inverter 858 resets counter 859 to 0. During the operation of the tester, counter 859 is incremented by clock pulse C4 from clock generator 710. The address from counter 859 is also inputted to register 877 which provides an input to computer interface 500 (FIG. 2) indicating the last address in memory array 864 that was used by the test evaluator. The output of memory array 864 is connected to the input of data-out register 865. Data out register 865 has an input to gate 70 (FIG. 2) and several inputs to the test evaluator of FIG. 11B. Data is read out of memory array 864 into data-out register 865 in response to a signal from clock generator 710 (FIG. 11B) which signal is inputted to both memory array 864 and data-out register 865.

As was previously pointed out computer interface 500 also provides an input to registers 842 and 843. This input information identifies the pair of machines to be compared. The output of registers 842 and 843 is applied to the input of gate 844. An input from AND circuit 745 (FIG. 11B) determines which of the registers 842 and 843 provides an input through gate 844 to gate 70 (FIG. 2). When AND 745 is a 1-level, register 843 is connected, while register 842 is connected to gate 70 when AND 745 is a 0 level. A further input from gate 753 (FIG. 11B) to registers 877, 854, and 855 provides the clock input to these registers. As was previously pointed out register 877 contains the last address of memory array 864 used by the test evaluator. Register 855 provides the information whether the test evaluator rejected the particular pattern in register 50 (FIG. 2). Register 854 provides further information to the CPU if the pattern is accepted.

With continued reference to FIG. 11B, a number of inputs are received into test discriminator 701. Test discriminator 701 is described in greater detail in FIG. 12. The output of test discriminator 701 and an input from latch 61 (FIG. 2) are provided as inputs to OR circuit 788 the output of which is inverted by inverter 740 and inputted to AND circuit 741, gate 753, AND circuit 752, and AND circuit 751. AND circuit 741 receives a second input from delay circuit 67 (FIG. 2) the same signal from delay circuit 67 also being inputted to gate 753. The output of AND circuit 741 starts clock generator 710 and sets latch 711. Clock generator 710 provides four clock timing signals. The first clock signal C1 is provided to memory array 864 and data-out register 865. The second clock pulse C2 is provided to OR circuit 609 in FIG. 7. Third clock pulse is provided to AND circuit 750 while the fourth clock pulse is provided to AND circuit 712 and counter 859. Compare circuit 746 provides an exclusive OR function comparing the double-rail logic input from block select 605 with the bit zero output of data-out register 865. Compare 746 provides a one level logic output when the logic value represented by the double rail logic from block select 605 matches the input from data out register 865. In the event that the input from block select 605 is indeterminate (a logic X) then the output of compare 746 will not indicate a match. The bit one output of data-out register 865 is inputted to exclusive OR 749 as well as to AND circuit 752, invert circuit 713 and AND circuit 745. Exclusive OR 749 is a conventional exclusive OR circuit providing an input to AND circuit 750. This signal being at a 1-level allows a C3 clock pulse to gate 753 through AND circuit 750. Gate 753 gates either the signal from AND circuit 750 or from delay circuit 67 (FIG. 2) depending on whether the output from invert circuit 740 is at a 1 level or a 0 level respectively.

The output of gate 753 conditions both AND circuit 756 and AND circuit 758 such that one of these latter two AND circuits provides an output signal. Each of AND circuits 756 and 758 also receives an output signal from AND circuit 752, AND circuit 758 receiving the inverted output of AND circuit 752 through inverter 757. In the event that the output of AND circuit 752 is a binary one then AND circuit 756 provides a discard pulse to latch 601 and OR circuit 602 in FIG. 7. In the event that the output of AND circuit 752 is a zero, AND circuit 758 provides an apply pulse to delay circuit 920 (FIG. 13) and to registers 40 and 606 (FIG. 7). The output of gate 753 is also provided as an input to clock generator 710 turning it off. The output of gate 753 is also provided to registers 854, 855, and 877 in FIG. 11A gating data into each of these latter three registers. The output of AND circuit 752 is also provided to register 855 in FIG. 11A this being the data input to register 855. As was previously mentioned the C4 output of clock generator 710 is inputted to AND circuit 712 and counter 859 (FIG. 11A). AND circuit 712 also receives an inverted input from data-out register 865 (FIG. 11A) through inverter circuit 713. The output of AND circuit 712 is connected to the reset input of latch 711, the latch output being provided to AND circuit 745 and invert circuit 714. In the event that both inputs to AND circuit 745 are at an up level, an output is provided to gate 844 (FIG. 11A) connecting the output of register 843 in preference to register 842 to gate 70 (FIG. 2). The inverted output of latch 711 is inputted through inverter 714 to AND circuit 751 which provides an output to register 854 (FIG. 11A) this being the data input to this register.

Figure 12:
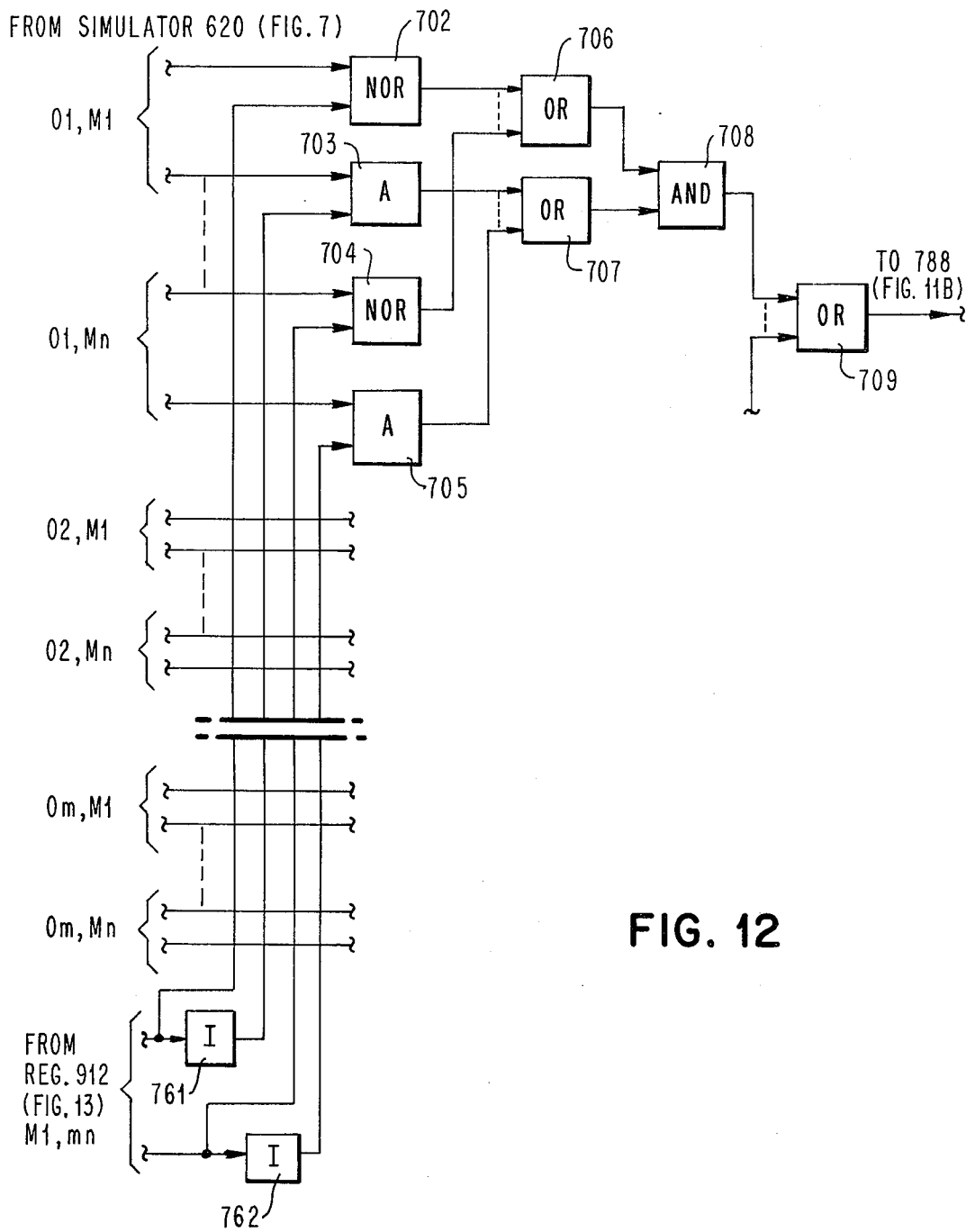
FIG. 12 illustrates the test discriminator 701 of FIG. 11B in a more detailed logic diagram.

For a more detailed description of test discriminator 701, refer now to FIG. 12 which includes a more detailed block diagram of the test discriminator. The test discriminator receives a first set of inputs from simulator 620 (FIG. 7). A second set of inputs including the lower most two inputs illustrated on FIG. 12 are received from the comparator and more specifically register 912 of the comparator of FIG. 13. From the simulator are received the primary outputs of all the machines in double rail logic. The O1, M1 input represents the first primary output from the first machine which is inputted to NOR circuit 702 and AND circuit 703. The O1, MN input indicates the first primary output from the Nth machine inputted to NOR circuit 704 and AND circuit 705. It is here understood that for all the primary outputs for all the machines between the first machine and the Nth machine a separate NOR circuit and AND circuit connected as for the first and Nth machines are provided. The O2, M1 input represents the second primary output from the first machine while the O2, MN input represents the second primary output from the Nth machine. The OM, M1 input represents the Mth primary output from the first machine while the OM, MN input represents the Mth primary output for the Nth machine. It is again recognized that each pair of inputs has associated NOR and AND circuits as is illustrated by NOR circuit 702 and AND circuit 703 for the first primary output of the first machine (O1, M1). NOR circuit 702 receives a second input from the comparator. The second input is at a one level if the first machine is to be ignored by the test discriminator. This one level signal is inverted by inverter signal 761 and applied as a zero to AND circuit 703 preventing AND circuit 703 from having a one output. In the alternative, a zero level input from the comparator to NOR circuit 702 will indicate that machine 1 is still under consideration. This zero level input will also be inverted by inverter 761 providing a one input to AND circuit 703 permitting the second line of double rail logic for O1, M1 to pass through AND circuit 703 as an input to OR circuit 707. A second input from the comparator is shown applied to NOR circuit 704 and to AND circuit 705 through inverter 762 and performs the same purpose for the Nth machine. Similarly, an input from the comparator is applied to all the corresponding NOR and AND circuits for all the other machines, and fan out to the corresponding NOR and AND circuits for all the other outputs of each machine, these other circuits not being shown in order to simplify the illustration. OR circuit 706 receives the output of NOR circuit 702, NOR circuit 704, and all the other NOR circuits receiving the 01 primary output of all the machines. OR circuits 707 receives the output of AND circuit 703, AND circuit 705 and all other AND circuits receiving the 01 primary output of all machines M1 through MN. The outputs of OR circuits 706 and 707 are applied to AND circuit 708 which provides an input to OR circuit 709. It should be recognized that OR circuits 706 and 707 as well as AND circuit 708 are repeated for each primary output. OR circuit 709 receives the input of all AND circuits corresponding to AND circuit 708 and provides an output to OR circuit 788 FIG. 11B.

Refer now to FIG. 13 which shows in greater detail the discriminator 86 and comparator 900 of FIG. 2. For purposes of illustration and ease of explanation, only portions of the overall discriminator and comparator circuits are shown. It is apparent that the illustrated circuits are repeated for the various primary output signals and the various machines under consideration. Discriminator 86 (FIG. 2) consists of a plurality of voltage detectors 87, 88, 87M, 88M, etc., a pair of voltage detectors being associated with every primary output of the device under test. Voltage detector 87 is an analog device receiving a reference potential being the equivalent of a minimum potential indicating a 1 level. Voltage detector 88 is also an analog device receiving a reference potential being the maximum permitted potential for a 0 level. Each of the voltage detectors 87 and 88 also receive an input from device under test 84 (FIG. 2). For purposes of example assume that the detectors 87 and 88 receives the output of the first primary output of the D.U.T. Then the output of the second primary output pin of the D.U.T. would be applied to a second set of voltage detectors identical to voltage detectors 87 and 88 which are not shown for ease of explanation. The output from the Mth primary output of the D.U.T. would then be applied to voltage detectors 87M and 88M as shown. The remainder of the circuitry of FIG. 13 is found in the comparator. The output of voltage detector 87 is applied to NOR circuit 908 while the output of voltage detector 88 is applied to AND circuit 906. Similarly, the output of voltage detector 87M is applied to NOR circuit 908M while the output of voltage detector 88M is applied to AND circuit 906M. It is again pointed out that the NOR circuits between 908 and 908M as well as the AND circuits between 906 and 906M are also not shown for ease of explanation. These NOR circuits such as circuit 908 receive a second input from simulator 620 (FIG. 7). Each of the AND circuits 906 through 906N also receives an input from simulator 620 (FIG. 7). Each such pair of inputs from simulator 620 represents the double rail logic implementation of one primary output of one simulated machine. Thus, for example, the inputs to NOR circuit 908 and AND circuit 906 could be the first primary output of the first machine (O1, M1). Successive NOR and AND circuits would receive the successive primary outputs of the first machine M1. Thus, NOR circuit 908M and AND circuit 906M would receive the output from the mth primary output of the first machine (Om, M1). The outputs of all the NOR and AND circuits 908, 906 through 908M, 906M are applied to OR circuit 904 which represents an OR circuit for all the primary outputs of the first machine M1. As just described, the foregoing circuitry leads to a comparison of the device under test with the first machine. Additional NOR circuits, AND circuits, and OR circuits are connected for comparison with the primary outputs of subsequent machines. Thus, each machine has a corresponding OR circuit to OR circuit 904.

The output of OR circuit 904 is applied to AND circuit 910 and AND circuit 916. AND circuit 910 also receives a doubly delayed signal from AND circuit 758 (FIG. 11B) through delay circuit 920 and delay circuit 922. This doubly delayed input is also applied to other AND circuits such as AND circuit 910, one for each of the other machines to be compared. The output of AND circuit 758 (FIG. 11B) is an apply signal telling the tester to apply the particular test pattern and in its doubly delayed form is applied to AND circuit 910 and the other related AND circuits in order to gate the results of the test into register 912. AND circuit 910 gates the output specifically to latch 912A. Subsequent AND circuits would gate the output into subsequent latches within register 912. The output of register 912 is applied to computer interface 500 (FIG. 2) and to the test discriminator (FIG. 11B). Register 912 including latch 912A and the other latches also receives a reset signal from AND circuit 64 (FIG. 2) in order to reset the latches prior to the application of the first pattern in the series of patterns to be applied. The output of the latch is also supplied to AND circuit 916. This is a complemented output of latch 912A. The output of AND circuit 916 is applied to OR circuit 914. It is of course understood that each of the other latches in register 912 such as latch 912A have associated AND circuits such as AND circuit 916 each of them providing an input into OR circuit 914. The output of OR circuit 914 is applied as an input to register 902. Register 902 receives a clock input from delay circuit 920. The output of OR circuit 914 is a one if the test has succeeded in eliminating one or more machines in which case the output of register 902 is a one which is applied to computer interface 500 (FIG. 2). If no machines have been eliminated by the test, OR circuit 914 has a zero output passing the zero through register 902 to computer interface 500.

OPERATION

The test operation is controlled by the Central Processing Unit (CPU) 20 (FIG. 2), which includes a means for analyzing faults and a means for generating a test input pattern. The means for analyzing faults operates in the manner described by FIGS. 4, 5, 6 and 6A. The means for generating a test input pattern operates in the manner described by FIGS. 14, 15 and 16. A logical model of the device under test is stored in memory 10. An assumed fault list also is stored in memory 10. An example of a logical model is shown in FIG. 3A and a fault list is shown in FIG. 3B for the device under test shown in FIG. 3.

Although the example shown in FIG. 3 is combinational logic, this invention is especially intended to handle sequential logic. This requires that the simulator 600 (FIG. 2) be initialized, and this is accomplished in the manner described in U.S. Pat. No. 3,633,100 in which a similar simulator is described. In the present case this initialization is accomplished by writing an input pattern of all 1's into register 50 via the data channel 30 and computer interface 500. (Hereafter it will be implicity understood that all transactions between the CPU and tester involve the data channel and computer interface.) The CPU writes a 1 into latch 61 and initiates the tester by writing a 0 followed by a 1 into latch 62. This causes the tester to process the all 1's input pattern in the manner to be described later, and then to cause latch 65 to switch to 0 signalling the CPU to resume its operation. The CPU then ignores this test result and writes an all 0's input pattern into register 50, and initiates the tester as before. The test results from the all 0's input pattern are not ignored. Instead the CPU begins its normal test operation described in detail hereinafter.

Basically, the normal test operation proceeds as follows:

The test analyzer included within CPU 20 selects two machines to be distinguished. A machine is defined as either the good copy or any of the faulty copies of the logical model of the device under test. This process continues until no pair of machines remain to be analyzed, then the testing operation ceases and a diagnosis is printed, telling if the device under test is good or bad, and which of the faults from the assumed fault list could be the cause if it is bad.

If at least two machines remain to be analyzed, then the test analyzer selects two of them and the pattern generator is invoked. The pattern generator, also included in CPU 10 will either fail to generate a test pattern and flag the machine pair, then signal the fault analyzer to pick another pair; or it will succeed in generating an input pattern. In the latter case, the generated pattern is written into register 50, a zero is written into latch 61 (signalling the tester that this is not the first pattern. By the term tester is generally intended all of FIG. 2 other than D.U.T. 84, memory 10, CPU 20, and data channel 30.)

Information about the test objective is written into local memory 800, and the tester is initiated as before by writing a 0 then a 1 into latch 62. This causes a pulse to be emitted by single-shot 63, which sets latch 65 whose function is to signal that the tester is busy. The pulse from SS 63 also goes into the simulator directly and through delay 66. This causes the simulator to take the pattern from register 50 and simulate. Delay 67 is of sufficient duration to delay the single-shot pulse until the simulator has reached stability, at which time the pulse will initiate the test evaluator.

The test evaluator tells the simulator and the test generator whether to discard or keep the present input pattern. This determination is made from three sources of data. If latch 61 contains 1, indicating the first pattern, the (first) pattern is kept. If it is not the first pattern, but the simulator outputs indicate that the test distinguishes two remaining machines, the pattern is kept. If not the first pattern and the simulator outputs do not indicate a test, then the disposition of the pattern depends on an analysis of the test objective stored by the CPU in local memory. If the pattern is to be discarded, a discard pulse is sent to the simulator.

If the pattern is to be saved an apply pulse is sent to the simulator and to register 40. The input pattern is thereby applied to the device under test through the drivers 82. Comparator 900 reads the output of the D.U.T. 84 from discriminator 86, compares the output with the simulator outputs for all machines, and flags all machines that do not match the D.U.T. These flagged machines are thereafter ignored by the CPU and the test evaluator.

After a sufficient time for the simulator and comparator to stabilize, the test evaluator sends a completion pulse to busy latch 65, allowing the test generator to resume operation.

Registers 40 and 50 contain input patterns which are to be applied to the simulator and the device under test. An input pattern is defined by one bit for each primary input of the device under test; each bit contains the logic value corresponding to the voltage level to be applied on the corresponding input pin. Register 40 is loaded in parallel from register 50; register 50 is loaded from computer interface 500 serially by byte and parallel by bits within each byte. All registers in FIG. 2 are loaded under control of a clocking pulse from computer interface 500 or in the case of register 40 from test evaluator 700. The clock input of register 40 is controlled by test evaluator 700, while register 50 is under complete control of the computer interface.

The computer interface 500 accepts information from the data channel 30 in the form of addresses and data. When the CPU writes information to the tester, the address specifies which register in the tester is to be loaded with the given data. The computer interface decodes the address and sends a clocking pulse to the appropriate register which then takes the data from the data bus. When operation in read mode, the decoded clock pulse is sent to a selector within the computer interface which connects the output of the appropriate register to the data channel.

FAULT ANALYZER

Referring to the flowchart in FIGS. 4, 5, 6 and 6A, the means for analyzing faults within CPU 20 will be described. First the tester is initialized by the steps 402 through 414. At 402, an input pattern of all 1's is written into register 50. Step 404 writes a 1 into latch 61 to signal the tester that this is the first input pattern. Step 406 writes a 0 into latch 62, then writes a 1 into latch 62; this triggers single-shot 63 which produces the start pulse to the simulator 600 and the remainder of the tester. Decision box 408 reads latch 65 to detect when the tester has completed its operations. Following this an all 0's input pattern is written into register 50 at step 410. Latch 61 is left holding a 1, which tells the tester to treat this also as the first pattern. Step 414 starts the tester as in step 406, and at 416 the fault analyzer waits for the tester to complete, as in step 408. This procedure of applying all 1's followed by 0's on the primary inputs synchronizes the simulator with the device under test, in accordance with the method described in U.S. Pat. No. 3,633,100 at claim 37, and in the specification at column 16 lines 18 et seq.

Step 418 reads register 855 in the local memory which contains a value of 0 if the pattern just sent to the tester was accepted. If the pattern was accepted, as is always the case with the first pattern, the fault analyzer reads register 902 which contains a value of 1 if any machines were eliminated by the comparator as a result of the test. If no machines were eliminated, register 854 is checked to see if the test met the test requirements of the test generator. These requirements are explained in the description of the preparer. The description of the test evaluator explains how it determines if the requirements are met. For the first pattern, register 854 is always set to 0, so step 422 is executed next.

The fault analyzer determines which of the faults in the list (FIG. 3B for example) remain to be analyzed by reading register 912 in comparator 900. For the example, only the first seven bits of register 912 would be meaningful, and these bits will be set to 1 as the corresponding machines are disposed of by a mismatch with the device under test.

Decision 424 is made as follows:

The contents of register 912 are searched for a 0; if no 0 exists among the meaningful bits, then all machines mismatched the device under test, proving that the device is not good and does not have any of the assumed faults. In this case, the branch is taken to NODIAGNOSTIC, the message in step 448 (FIG. 6A) is printed, and the CPU stops.

If some faults remain, the index position of the first 0 in register 912 is saved as a variable MI, which may be defined as the first machine on the list that is still under consideration (Step 426). Box 428 flags fault MI, in the vector FM, (FM being a binary vector containing 1 bit position for each machine and containing a value of 1 if that machine has been eliminated by comparator 900 or given up on by the test generator) where the contents of register 912 were saved. This causes the search of a 0 in decision 430 (FIG. 5) to find the second remaining fault. With continued reference to FIG. 5, if two faults do not remain, the device under test has matched only the machine MI, and OMI will be listed as the diagnostic following the branch to diagnose.

If a second fault remains, its index is saved as variable FX (Step 432). The test generator, also referred to as the means for generating a test input pattern, including the preparer and the backtracer routines, illustrated at FIGS. 14 and 15 respectively, will attempt to generate an input pattern for which machines MI and FX have differing outputs, thereby enabling the tester to flag one or both as not matching the device under test. Step 434 invokes the preparer routine which derives a test requirement in terms of a machine (either MI or FX), a logic block in the model of the machine, and a desired logic value to be produced on that block.

Step 436 invokes the backtracer, which translates the given logic block and value into a required value on some primary input.

Step 440 checks a flag returned by the backtracer which is set to 1 if the backtracer was unsuccessful in deriving a primary input value. If unsuccessful, fault FX is flagged in vector FM.

If the backtracer reached a primary input, then a new input pattern is derived from the previous one simply by inverting the value on that input.

Step 444 accomplishes this by reading the previous pattern from register 40, performing the inversion, and writing the new pattern into register 50.

The test requirement and other pertinent information for the test evaluator are written into the local memory of the tester. (Step 445)

Step 446 writes a 0 into latch 61, signifying that this is not the first pattern, and control branches to step 414, where the tester is started as before.

Following completion of the tester operation for any pattern subsequent to the first, register 855 may contain a 1, meaning that the test evaluator rejected the pattern and did not apply it to the device under test. This situation is detected by the fault analyzer at decision 418, where a branch to BACK is taken. Following this, step 438 invokes the backtracer with the backup option which asks the backtracer to look for another primary input to satisfy the test requirement originally specified by the preparer.

Figure 6:
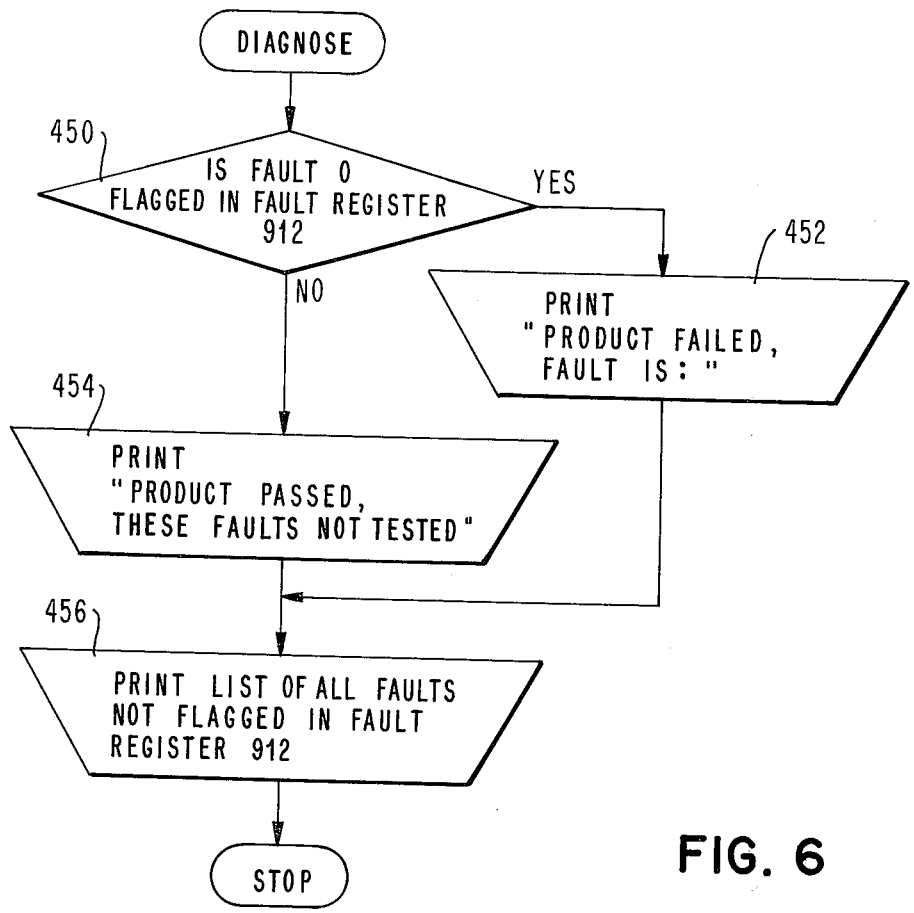
Figure 6A:
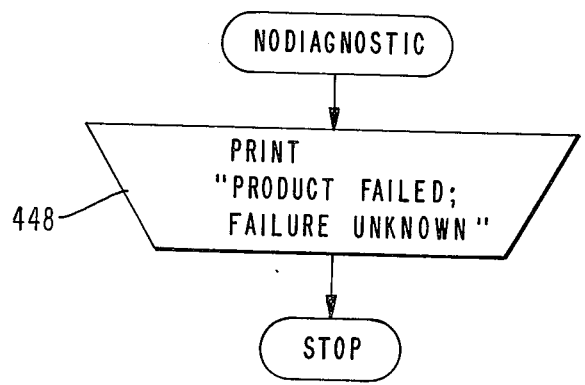

The diagnose routine begins by deciding at step 150 whether the good machine was flagged, which is to say whether the device under test is good or bad. This is accomplished by first reading register 912 which contains the flags for those machines which do not match the device under test, and checking the first bit for a 0, which indicates the device is good. Referring now to FIG. 6, "product failed" or "product passed" messages are printed by steps 452 or 454 respectively, followed by a listing of all unflagged faults. The unflagged faults are those that may exist in the device under test (456). If the product passed, then these untested faults represent a risk that the device is bad; if product failed, these untested faults are the possible causes of malfunction.

SIMULATOR

Referring to FIG. 7, the simulator provides means for predicting the state of each of the machines described by the good logic model and the several assumed faults. This prediction is made by the 3-level simulated reference 620.

The 3-level simulated reference is similar in construction to the 3-level simulated reference described in U.S. Pat. No. 3,633,100. The two differences are, the present invention requires that all signal loops in the simulated logic be brought out through register 606 and gate 607, and the present invention also requires simulation of faults as well as the "good" logic. The simulation is performed by implementing the device under test in three-valued logic. One way this is done uses double rail logic, whereby each logic value is represented by two redundant bits using a code such as that shown in FIG. 9. Binary logic is implemented in double rail form as shown in FIGS. 9A–9C where the same two-bit code is used.

FIG. 10A shows a double rail implementation of the logic in FIG. 3. The faults to be simulated may be any kind implementable in ternary logic. Each fault is simulated by a separate implementation of the entire logic of the device under test, modified in the manner dictated by the particular fault. Typically, faults of the stuck 1 or stuck 0 variety are assumed. As an example of how this is done, FIG. 10B shows the part of the logic within the simulated reference which would simulate the machine corresponding to B5 stuck 1 in the example of FIG. 3.

The predicted state of any logic block in the model is made available to the CPU or the test evaluator by means of decode 604 and block select 605. Latch 65 determines the source of the block request by gate 70 which connects register 865 and gate 844 in the local memory. The clock pulse to register 603 is supplied through OR circuit 609 from the computer interface or the test evaluator. Decode network 604 contains one output line corresponding to each block in the simulated reference. The line corresponding to the block number in register 603 is put to 1, while all other lines are 0. The block select is connected to all blocks in the simulated reference, and functions by masking the block values by the lines from decode 604 and OR'ing the result to produce the selected block value on its output. The masking and OR'ing are duplicated, once for each of the two bits comprising a block value.

In FIG. 8 is shown the circuitry to select block number 5 from a maximum of 64 blocks. The block is selected by the AND circuit which is fed by the true or complemented signal from each bit of register 603.

The masking is performed by the pair of AND circuits which are connected to the two circuits in the 3-valued logic model corresponding to block 5. Each OR circuit in the block select is connected to one of the AND's corresponding to every logic block.

The simulator provides means for allowing the test evaluator to reject each input pattern immediately after the pattern is simulated. For sequential logic, this requires some facility for restoring the logic to the state it had prior to the application of the rejected pattern. This is accomplished by bringing all signal loops in the simulated reference out through register 606 and gate 607, leaving only combinatorial logic within 620. The start pulse from single-shot 63 sets latch 601 such that gate 607 connects all feedback outputs from 620 directly to the feedback inputs to 620. This is considered the normal case. Also, when latch 601 has been set by single-shot 63, gate 608 connects convertor 610 to register 50, which contains the next input pattern. When the test evaluator accepts a pattern, a pulse is sent from AND circuit 758 into registers 40 and 606. Register 40 not only provides the input pattern to the device under test but also saves the pattern, as register 606 saves all the feedback values. If a subsequent pattern is placed in register 50, simulated and rejected, the test evaluator produces a pulse on AND circuit 756, which switches latch 601 and causes the input to the convertor 610 to be connected to register 40 and causes the feedback inputs to be connected to register 606. This produces the same state as before, when the contents of registers 40 and 606 were saved. A different new pattern may then be placed into register 50 and simulated by again triggering single-shot 63. Gates 607 and 608 must be designed free of static hazards so that the feedback state is not lost when latch 601 switches back to its normal state.

Convertor 610 is the same convertor to 3-level logic described in U.S. Pat. No. 3,633,100. Its detailed operation is not relevant to the present invention. Its function is to accept the binary signal pattern from gate 608 and convert it to the ternary pattern code used by the simulated reference, inserting the indeterminate X value on any primary input which changes state, this X value lasting for the amount of time equal to delay 66. After rejection of a pattern, primary inputs which change in reverting to the pattern in register 40 are not required to undergo this X state, hence the reject pulse from circuit 756 passes directly into the converter through OR circuit 602 without any delay.

TEST EVALUATOR

Referring now to FIG. 11B, it is the function of the test evaluator to determine the acceptance or rejection of each test pattern. It examines the output from the simulator, and whenever necessary, also examines particular logic block states under guidance from data stored in local memory by the CPU.

The test discriminator 701 detects the appearance of a test value on the primary outputs of the simulator. A test value is defined as the occurrence of a logic 1 or logic 0 on a primary output of one machine, and the simultaneous existence of the opposite 0 or 1 logic value on the corresponding primary output of any other machine, provided both machines have not yet mismatched the device under test. Note that when this condition arises, application of the test to the device will ultimately result in one of the two machines mismatching the device, improving the current diagnostic resolution.

Attached to each primary output from each of the simulated machines are a pair of logic circuits. Referring to FIG. 12, NOR circuit 702 and AND circuit 703 are attached to output 1 of machine 1 from the simulator.

OR circuit 706 is connected to all the NOR circuits attached to output 1 of all simulated machines. Each NOR circuit also takes as an input the tested flag bit from register 912. Only those NOR circuits corresponding to an untested machine and an output logic value of 1 will have a 1 level output. Thus, OR circuit 706 detects the existence of a logic 1 on output 1 of any untested machine. Similarly, OR circuit 707 detects the existence of a logic O on output 1 of any untested machine.

The AND circuit 708 detects a test value on output 1 by checking for both the existence of a 1 signified by circuit 706 and the existence of a 0 signified by circuit 707. OR circuit 709 is connected to all the AND circuits corresponding to 708 for each primary output, thus it detects a test value on any primary output.

If the test discriminator OR circuit 709 produces a 1, indicating a test value, or first pattern is being applied, circuit 740 is a 0 indicating acceptance of the test. In this case, gate 753 is conditioned to take its input from delay 67, and AND circuit 741 blocks the pulse from delay 67 from the clock generator and control logic. AND circuits 751 and 752 are also set to 0 by circuit 740. 752 in turn holds AND circuit 756, the reject line to 0. The pulse arriving from delay 67 then passes through gate 753 and writes 0 into registers 854 and 855. Inverter 757 allows the pulse through AND circuit 758, which is the accept line. The pulse leaving gate 753 also passes through delay 89 to reset the "tester busy" latch 65 after allowing time for the application of the test and analysis of test results.

On the other hand, when the output from circuit 740 is 1, the start pulse from delay 67 passes through AND 741, initiating the clock generator 710 and setting latch 711. Clock generator 710 produces the waveforms shown in FIG. 11C. A repetitive series of non-overlapping pulses is produced on line C1 through C4, beginning with C1 after the initiate pulse is received.

With reference to FIG. 11A note that the CPU 20 previously stored certain data in local memory as will now be described.

Register 842 contains the number M1 which identifies one of the two machines that the test generator was analyzing to produce the current test pattern, while register 843 contains M2, the number of the other machine.

The combined worklist and assignment list are stored in memory array 864. Each worklist entry specifies a logic block number within machine M1 which the test generator requires to be in the particular logic state also specified as part of the worklist entry. The first worklist entry has been referred to elsewhere as the "test requirement" from which the input pattern was derived. The last worklist entry specifies the particular primary input which was inverted from its previous state to derive the current input pattern.

The assignment list specifies logic block states in the same manner as the worklist. Each assignment list entry is associated with a particular worklist entry. Each assignment entry specifies the logic state that the assigned block had prior to the current test pattern, and means that that logic state is not allowed to be disturbed unless the associated worklist entry is satisfied.

Assignments are stored immediately following their associated worklist entries in memory array 864 and are flagged in bit 1 of the word in which they are stored to distinguish them from worklist entries. (Bit 0 contains the logic value while remaining bits identify the block within the logic model.) Any assignments which appear before the first worklist entry refer to machine M2, identified by the number in register 843. If any of these assignments are disturbed by the current test pattern, the pattern is to be rejected. Otherwise, if the first worklist entry is satisfied the pattern is to be accepted, with register 854 being set to 0, indicating that the test requirement was met. The pattern is also rejected if any assignment is disturbed and no lower-numbered worklist entry is satisfied. If a worklist entry is found to be satisfied where no lower numbered assignments are disturbed, then the pattern is accepted, register 854 is set to 1 to indicate that the test requirement is not yet met, and the position of the worklist entry in array 864 is saved in register 877. Note that the above described arrangement of data within the array allows the test evaluator to sequentially analyze the entries, stopping if either an assignment is found to be in conflict or if a worklist entry is found to be satisfied, whichever occurs first. Latch 65 resets counter 859 to zero each time the tester completes operation for one test. Thus, when the test evaluator begins operation on the first or subsequent test patterns counter 859 contains a zero and latch 65 is conditioning gate 861 to accept an input from the counter. Gate 861 feeds the memory array address lines.

Clock pulse C1 reads a worklist or assignment entry from array 864 and causes this data to be put into register 865. AND circuit 745 conditions gate 844 to select register 843 (M2) if latch 711 is set (no worklist entries have yet been analyzed) and if the data in register 865 is an assignment. The block number and machine number produced by register 865 and gate 844 are sent to register 603 in the simulator. Clock pulse C2 reads this data into register 603. It is decoded, and the selected block value appears on the output of the block select logic 605. Compare logic 746 produces a 1 output if the selected simulator block value is the value specified by the data entry in register 865. This result is fed to exclusive-OR circuit 749. Exclusive-OR 749 determines if the worklist analysis is complete; if the desired and simulated values do not match and register 865 contains an assignment, or if they do match and the data is a worklist entry, then circuit 749 produces a 1 allowing pulse C3 to pass through AND circuit 750. Inverter 740 has conditioned gate 753 to take input from circuit 750, so the pulse passes through the gate, turns off the clock generator so no more pulses appear, clocks data into registers 854 and 855, passes through either AND gate 756 or 758 to reject or accept the test pattern, and saves the work-assignment list address in register 877. AND circuit 752 determines whether the pattern is to be rejected or accepted, depending upon whether bit 1 of data register 865 indicates that the analysis stopped with an assignment entry (conflict) or a worklist entry (accept). If exclusive-OR 749 blocks the C3 pulse at AND circuit 750, analysis continues by pulse C4 incrementing the array address in counter 859, followed by another C1 pulse, and so on. If data register 865 contained a worklist entry, inverter circuit 713 was a 1 at the time of the C4 pulse, which allows latch 711 to be reset. This signals that the first worklist entry has been analyzed, and causes AND circuit 745 to remain 0 for the rest of the analysis, selecting machine number M1 from register 842. AND circuit 751 determines if the test requirement was met. The test requirement is considered not met if the test discriminator indicated no test, this is not the first pattern, and the worklist analysis did not stop with the first entry. When all these conditions are met, inverter 740 is a 1, and latch 711 is a 0. Only then AND circuit 751 produces a 1, telling the test generator to continue working on the same test.

COMPARATOR

Referring now to FIG. 13 register 912 of the comparator contains one latch for each machine. The latch is set to 1 if that machine has been proven to be different from the device under test. The objective of the test system is to find a match between the device under test and exactly one machine; thus this register is the heart of the system. The function of the comparator is to maintain the data in register 912.

AND circuit 64 produces a pulse coincident with the start simulator pulse if the pattern is the first test pattern to be applied. This resets all the latches in register 912. The comparator uses all the primary outputs of all the simulated machines and the primary outputs from the device under test to determine if a machine is to be eliminated from further consideration.

Voltage detector 88 compares the voltage on the output pin of the device under test with the maximum acceptance voltage for a logic 0, and produces a 1 if the device output is higher than a 0. AND circuit 906 produces a 1 if the device output is not 0, and the simulated machine output is 0. (The two-bit logic value code used by the simulator is shown in FIG. 9) Voltage detector 87 produces a 1 level response if the device output is higher than a minimum 1 voltage level. Thus, NOR circuit 908 produces a 1 if the device output is not a 1 and the simulated machine output is 1. (Both NOR inputs are 0.) If either circuit 906 or 908 produces a 1, then the machine driving this simulated output can be flagged. OR circuit 904 produces the flag bit for the machine by OR'ing the response pairs corresponding to circuits 906 and 908 for all primary outputs. OR circuit 904 and its input AND and NOR circuits are repeated once for each machine and drive one bit of latch 912 through the bank of AND circuits 910 which time the set pulses by the accept pulse from circuit 758 delayed through delays 920 and 922.

AND circuit 916 reads the complement of the latch value and the new flag. If the old value is 0, the new value is 1, then this machine is about to be flagged. OR circuit 914 detects if any machine is to be flagged, and this indication is saved in register 902 just before the latches are allowed to be set by delay 922. The fault analyzer uses the bit in register 902 to determine when to renew its flag bits by reading register 912.

PREPARER

Figure 14:
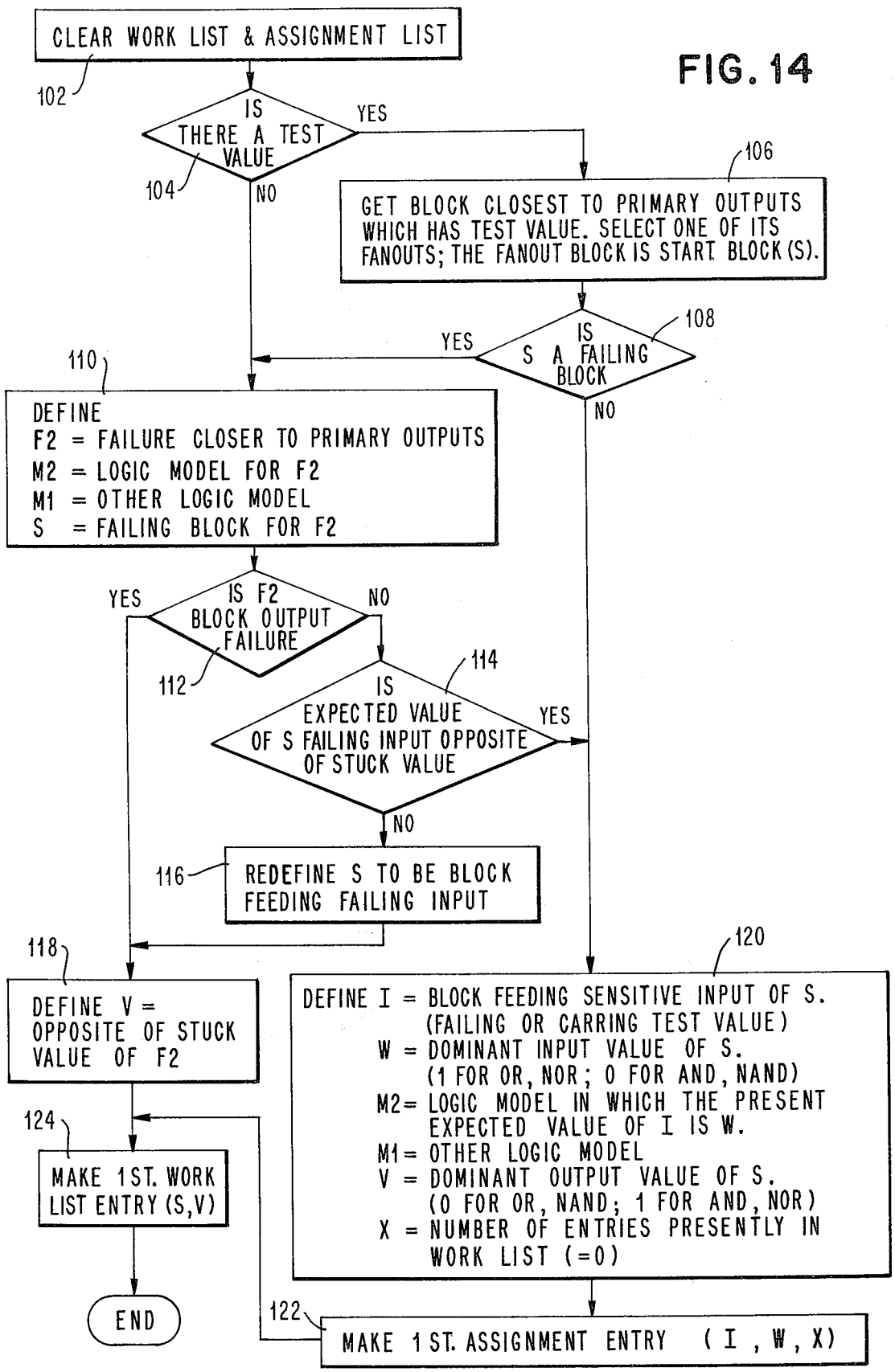
FIG. 14 is a flow chart illustrating in greater detail the operation of preparer within the CPU 20 of FIG. 2.

Refer now to FIG. 14 for a description of the preparer routine.

Step 102. The worklist and assignment lists are cleared in preparation for a new test.

Step 104. The simulator supplies the test generator routines with block values; one three-level value for each block in the logic being tested, for each machine (a machine being either the good logic, or one of the many possible failing logic configurations). Those lines (block values) corresponding to the two machines of interest are examined to determine if a test value exists at any block.

Step 106. If a test value exists, the output distances of all blocks where test values exist are compared and that block with the lowest output level is selected. Then the output distance of all blocks fed by this selected logic are compared. The one with the lowest output distance is identified as block S.

Step 108. Check for a fault (corresponding to either of the two machines of interest) existing on block S.

Step 110. If the good logic is one of the two machines of interest, then let F2 identify the failure. If both machines of interest are faulty machines, then the output distances of the corresponding failing blocks are compared, let F2 identify the failure on the block which has the lower output distance. (If both failures are on the same block, then an output failure is deemed closer to primary outputs than an input failure)

A logic model is constructed conceptually for each faulty machine by injecting the stuck-at signal into the good machine logic model. M2 refers to the logic model corresponding to F2, while M1 refers to the logic model of the other machine of interest.

Let the failing block for F2 be identified as S.

Step 112. Check to see if F2 is a block output stuck failure as opposed to a block input failure.

Step 114. Check for a virtual test value on the failing block input. This would happen if the expected value (supplied by the simulator) of the block in M1 (corresponding to the block feeding the failing input in M2) is opposite the stuck value of F2.

Step 116. No virtual test value exists. Let S now identify the block feeding the failing input of F2.

Step 118. Let V represent the binary value opposite the stuck value of F2.

Step 120. Either a test value or a virtual test value exists. Define I, W, M2, M1, V, X.

Step 122. Create an assignment list entry consisting of the vector (I, W, X). The third element, X, is a pointer to the worklist. For this entry, X = 0 because the worklist is still empty.

Step 124. Create first worklist entry consisting of the vector (S, V).

BACKTRACER

Figure 15:
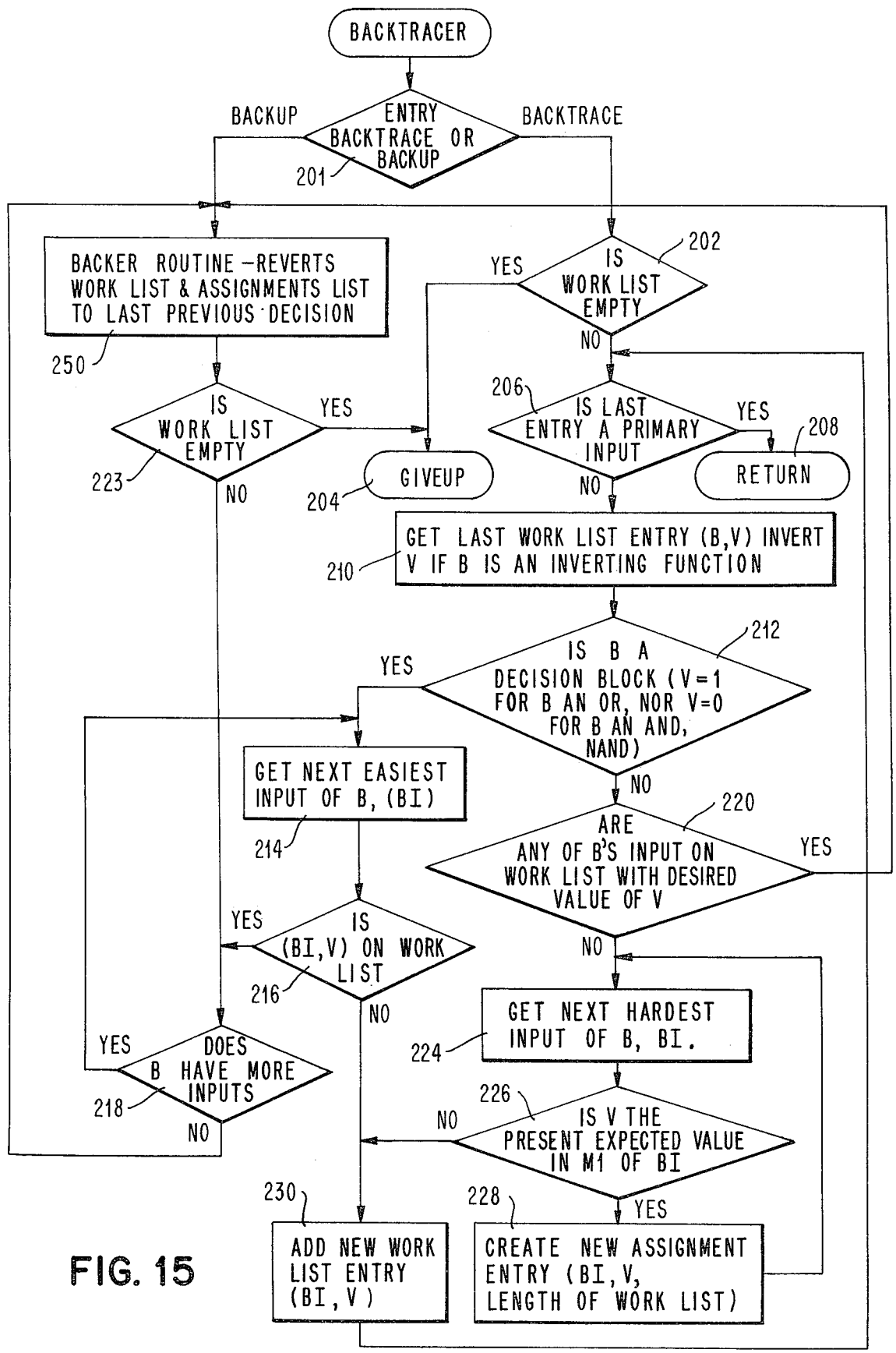
FIG. 15 is a flow chart illustrating in greater detail the operation of the backtracer in CPU 20 in FIG. 2.

Refer now to FIG. 15, for a description of the backtracer routine.

Step 201. Determine entry point called for by fault analyzer.

Step 202. Are any entries on the worklist?

Step 204. If worklist empty, then a test could not be found after exhausting all decision alternatives. Set indicator in failure list signifying this failure (FX) has been given up. Return control to fault analyzer.

Step 206. Check first element, B, of last worklist entry. Is B a primary input?

Step 208. If primary input, load input register with this input change. Pass control to fault analyzer.

Step 210. Place last work list entry in the vector (B, V) If B is NOR, NAND, function, then invert the V element in this vector. V now represents the desired value to be placed on B's input.

Step 212. Will only one of B's inputs need to be set to v?

Step 214. If decision block, examine weights of B's inputs. Let BI indentify the block feeding B which has the lowest input weight. When entering from Box 218 ignore inputs whose weights are equal or lower than the previous BI input, so that no inputs will be processed twice.

Step 216. Does the worklist contain an entry identical to the vector (BI, v)?

Step 218. The worklist was about to begin an endless repeating cycle. Select instead another input to block B. First check to see if any untried inputs exist by comparing the weights with the input weight for BI.

Step 220. If all inputs must eventually be set to V, then B is called an empty block. Scan the worklist to insure that no entry (BI, V) exists where BI is any input to B. This is to avoid endless repetition on the worklist.

Step 250. If a worklist entry (BI, V) is found, then try another alternative.

Step 223. If no decision block found, give up on fault. If decision block was found, check for more inputs.

Step 224. Process imply block inputs in decreasing weights order, retrieve (next) highest weighted input to B, call its come-from block BI.

Step 226. Check the value (suppled by the simulator) of the block BI in machine M1. Does its value equal v?

Step 228. Add the vector (BI, V, X) to the assignment list where X is a pointer to the last (current) worklist entry.

Step 230. Desired value, V, of block BI not equal simulator value. Create new worklist entry.

Figure 16:
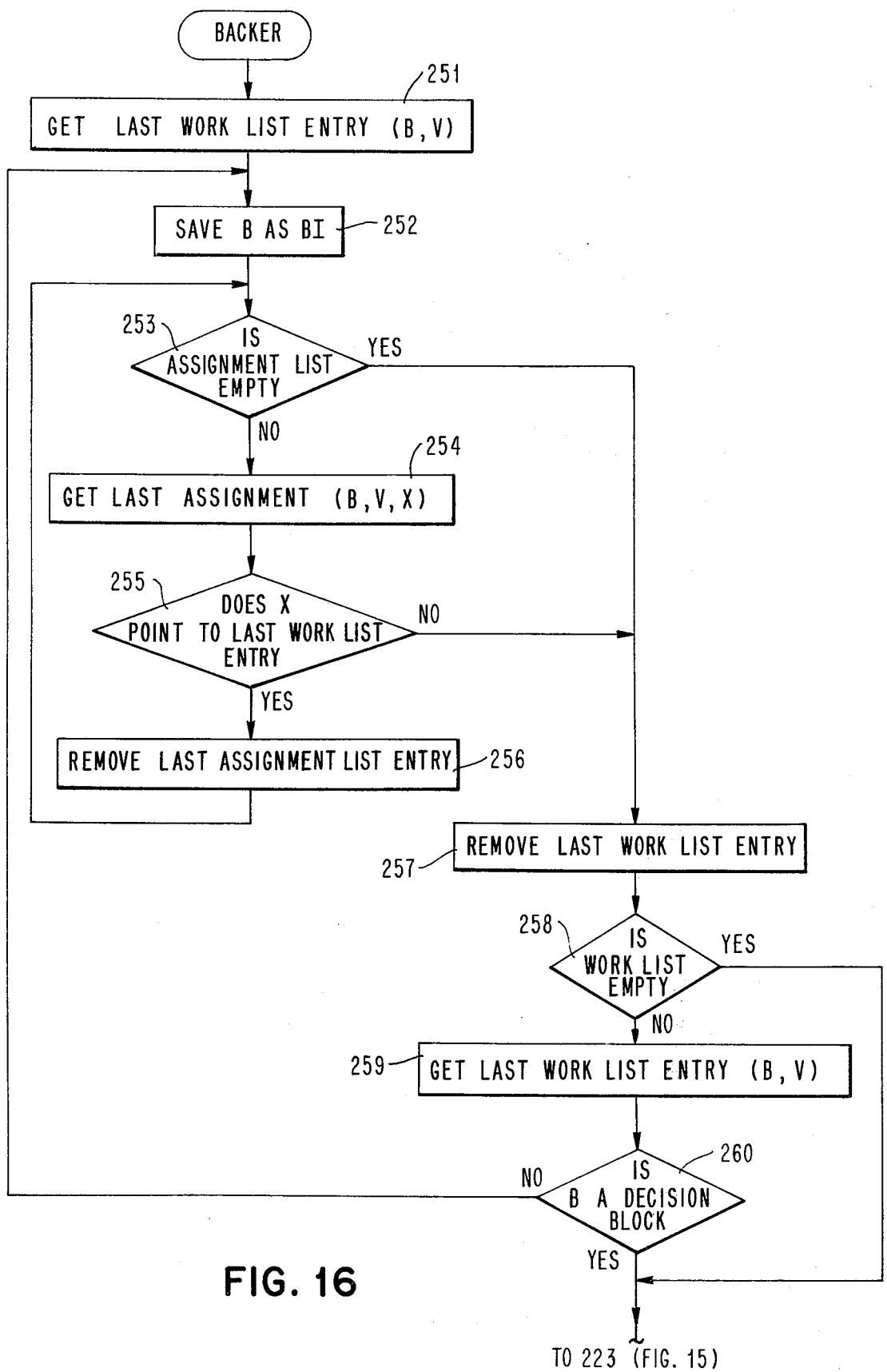
FIG. 16 is a flow chart illustrating in greater detail the backer routine shown in block 250 of the backtracer flow chart of FIG. 15.

Refer now to FIG. 16 for a description of the backer routine.

Step 251. The last worklist entry is retrieved.
Step 252. and the block saved as BI
Step 253. are there any assignments?
Step 254. Most recent assignment is retrieved,
Step 255. if it points to the worklist entry which is about to be removed,
Step 256. the last assignment is removed.
Step 257. Remove most recent entry form worklist.
Step 258. Check for more worklist entries.
Step 259. Examine last worklist entry
Step 260. to see if decision point; if no, go back to remove this worklist entry; if decision, pass control to decision block processor in backtrace.

In conclusion, what has been described is a fault oriented test system in which specific faults are assumed and test values associated with these specific faults are propagated toward a primary output, all within a simulated network. The particular test sequence required at the primary inputs, for this propagation, is obtained by iterative backtracing and the combined test set is applied to an actual network under test to determine whether any specific assumed fault is actually present.

While the invention has been shown and particularly described with reference to preferred embodiments, it will be understood by those skilled in the art that various changes in form and detail may be made therein without departing from the spirit and scope of the invention.

I claim:

1. A logic network tester for testing a logic network having a plurality of primary inputs and primary outputs and including a plurality of logic blocks having inputs and outputs, at least some of said inputs and outputs being inaccessible within the logic network, comprising:

simulator means for simulating the logic network to be tested and identifying the plurality of logic blocks and the inputs and outputs to each of said blocks;

means for applying a test pattern of binary valued signals to the primary inputs of said simulated network;

test evaluator means operatively associated with and responsive to said simulator means for determining whether said test pattern should also be applied to the network under test, and causing said means for applying a test pattern to apply said test pattern to the network under test, if desired; and comparator means responsive to both said network under test and said simulated network for comparing corresponding outputs of said network under test and said simulated network.

2. A logic network tester as in claim 1 further comprising:

means for simulating a specific fault within a particular logic block of said simulated network;

said means for applying a test pattern of binary valued signals to the primary inputs of said simulated network iteratively applying additional test patterns until a desired test value is obtained at a primary output of said simulated network and applying said same additional test patterns to the network under test;

said comparator means again comparing corresponding outputs of said network under test and said simulated network for determining whether the specific simulated fault exists in the network under test.

3. Method of testing a sequential logic network having a plurality of primary inputs and primary outpus and including a plurality of logic blocks having inputs and outputs, at least some of said inputs and outputs being inaccessible within the sequential logic network, comprising the steps of:

simulating the logic network to be tested and identifying the plurality of logic blocks and the inputs and outputs of each of said blocks;

applying a first test pattern of binary valued signals to the primary inputs of said simulated network;

selecting a particular one of said plurality of logic blocks and assuming a specific fault associated with said particular one logic block;

determining whether said actual binary values of the applied test pattern provide a test value for the assumed specific fault;

propagating said test value through said network toward a primary output;

backtracing through said network to find particular desired changes to the test pattern of binary valued signals applied to the primary inputs, for propagating said test value thereby generating a series of test patterns each successive test pattern altering only one of the binary valued signals applied to the primary inputs;

applying the generated series of test patterns to the actual logic network under test; and comparing the binary values of the primary outputs of the actual logic network under test with the primary outputs of the simulated logic network, thereby finding whether the assumed specific fault exists in the actual logic network under test.

4. Method of testing a sequential logic network as in claim 3 wherein the step of applying a first test pattern of binary value signals to the primary input of the simulated network simultaneously applies a first test pattern of binary valued signals to the primary inputs of the network under test and each successive pattern is applied to both the simulated network and the network under test on a real time basis.

5. Method of testing a sequential logic network as in claim 3 wherein the step of determining is followed by a first step of backtracing through said network to find a particular desired change to the test pattern of binary valued signals applied to the primary input until a test value is produced, before the step of propagating said test value through said network toward a primary output.

6. Method of testing a sequential logic network as in claim 5 wherein the steps of propagating and backtracing are iteratively repeated until the test value is propagated to a primary output.

7. Method of testing a sequential logic network as in claim 6 wherein any step of backtracing further determines that a test value cannot reach a primary output, thereby causing the step of selecting a particular one of said plurality of logic blocks and assuming a specific fault associated with said particular one logic block, to select a different specific fault.

8. The method of claim 6, wherein after each step of backtracing, further comprising the steps of:

applying each successive test pattern to the primary inputs of the simulated network; and evaluating the said successive test pattern to determine whether the said successive test pattern should be applied to the logic network under test.

* * * * *